(12) United States Patent
Kono

(10) Patent No.: US 11,734,947 B2
(45) Date of Patent: Aug. 22, 2023

(54) DETECTION DEVICE

(71) Applicant: Japan Display Inc., Tokyo (JP)

(72) Inventor: Takaaki Kono, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/993,061

(22) Filed: Nov. 23, 2022

(65) Prior Publication Data

US 2023/0169789 A1   Jun. 1, 2023

(30) Foreign Application Priority Data

Nov. 26, 2021 (JP) ................................. 2021-192137

(51) Int. Cl.
*G06V 40/13* (2022.01)
(52) U.S. Cl.
CPC ................................ *G06V 40/1318* (2022.01)

(58) Field of Classification Search
CPC ............. G06V 40/1318; G06V 10/145; G06V 40/1329; H04N 25/78
See application file for complete search history.

(56) References Cited

U.S. PATENT DOCUMENTS

| 2017/0124370 A1* | 5/2017 | He ........................ G06V 40/40 |
| 2018/0012069 A1 | 1/2018 | Chung et al. |
| 2018/0137325 A1* | 5/2018 | Mainguet ................ H01L 31/16 |

* cited by examiner

*Primary Examiner* — Abhishek Sarma
(74) *Attorney, Agent, or Firm* — K&L Gates LLP

(57) ABSTRACT

A detection device includes a sensor area in which a plurality of detection elements including photoelectric conversion elements are arranged in a matrix having a row-column configuration within a detection region, and a detector configured to calculate a detection value corresponding to the detection elements based on a voltage generated in the detection elements.

17 Claims, 31 Drawing Sheets

FIG.9

| m\n | 1 | 2 | 3 | ... | M-1 | M |
|---|---|---|---|---|---|---|
| 1 | V<1, 1>-Vref | V<2, 1>-Vref | V<3, 1>-Vref | ... | V<M-1, 1>-Vref | V<M, 1>-Vref |
| 2 | V<1, 2>-Vref | V<2, 2>-Vref | V<3, 2>-Vref | ... | V<M-1, 2>-Vref | V<M, 2>-Vref |
| : | : | : | : | : | : | : |
| N-2 | V<1, N-2>-Vref | V<2, N-2>-Vref | V<3, N-2>-Vref | ... | V<M-1, N-2>-Vref | V<M, N-2>-Vref |
| N-1 | V<1, N-1>-Vref | V<2, N-1>-Vref | V<3, N-1>-Vref | ... | V<M-1, N-1>-Vref | V<M, N-1>-Vref |
| N | V<1, N>-Vref | V<2, N>-Vref | V<3, N>-Vref | ... | V<M-1, N>-Vref | V<M, N>-Vref |

FIG.14

| m\n | 1 | 2 | 3 | ... | M-1 | M |
|---|---|---|---|---|---|---|
| 1 | A | A | A | ... | A | A |
| 2 | B | B | B | ... | B | B |
| : | : | : | : | : | : | : |
| N-1 | C | C | C | ... | C | C |

FIG.15

| m\n | 1 | 2 | 3 | ... | M-1 | M |
|---|---|---|---|---|---|---|
| 1 | V<1, 1><br>-V<1, 2> | V<2, 1><br>-V<2, 2> | V<3, 1><br>-V<3, 2> | ... | V<M-1, 1><br>-V<M-1, 2> | V<M, 1><br>-V<M, 2> |
| 2 | V<1, 2><br>-V<1, 3> | V<2, 2><br>-V<2, 3> | V<3, 2><br>-V<3, 3> | ... | V<M-1, 2><br>-V<M-1, 3> | V<M, 2><br>-V<M, 3> |
| : | : | : | : | : | : | : |
| N-1 | V<1, N-1><br>-V<1, N> | V<2, N-1><br>-V<2, N> | V<3, N-1><br>-V<3, N> | ... | V<M-1, N-1><br>-V<M-1, N> | V<M, N-1><br>-V<M, N> |

FIG. 18

| E/n | 1 | 2 | ... | N-1 | N |
|---|---|---|---|---|---|
| 1 | A | B | ... | C | D |
| 2 | E | F | ... | G | H |
| ... | ... | ... | ... | ... | ... |
| P | I | J | ... | K | L |
| P+1 | A | B | ... | C | D |
| P+2 | E | F | ... | G | H |
| ... | ... | ... | ... | ... | ... |
| 2P | I | J | ... | K | L |
| ... | ... | ... | ... | ... | ... |
| M-P+1 | A | B | ... | C | D |
| M-P+2 | E | F | ... | G | H |
| ... | ... | ... | ... | ... | ... |
| M | I | J | ... | K | L |

FIG.19

| n\m | 1 | 2 | ... | P | P+1 | P+2 | ... | 2P | ... | M-P+1 | M-P+2 | ... | M |
|---|---|---|---|---|---|---|---|---|---|---|---|---|---|
| 1 | V<1,1><br>-V<1,2> | V<2,1><br>-V<2,2> | ... | V<P,1><br>-V<P,2> | V<P+1,1><br>-V<P+1,2> | V<P+2,1><br>-V<P+2,2> | ... | V<2P,1><br>-V<2P,2> | ... | V<M-P+1,1><br>-V<M-P+1,2> | V<M-P+2,1><br>-V<M-P+2,2> | ... | V<M,1><br>-V<M,2> |
| 2 | V<1,2><br>-V<1,3> | V<2,2><br>-V<2,3> | ... | V<P,2><br>-V<P,3> | V<P+1,2><br>-V<P+1,3> | V<P+2,2><br>-V<P+2,3> | ... | V<2P,2><br>-V<2P,3> | ... | V<M-P+1,2><br>-V<M-P+1,3> | V<M-P+2,2><br>-V<M-P+2,3> | ... | V<M,2><br>-V<M,3> |
| ... | ... | ... | ... | ... | ... | ... | ... | ... | ... | ... | ... | ... | ... |
| N-1 | V<1,N-1><br>-V<1,N> | V<2,N-1><br>-V<2,N> | ... | V<P,N-1><br>-V<P,N> | V<P+1,N-1><br>-V<P+1,N> | V<P+2,N-1><br>-V<P+2,N> | ... | V<2P,N-1><br>-V<2P,N> | ... | V<M-P+1,N-1><br>-V<M-P+1,N> | V<M-P+2,N-1><br>-V<M-P+2,N> | ... | V<M,N-1><br>-V<M,N> |
| N | V<1,N><br>-Voffset | V<2,N><br>-Voffset | ... | V<P,N><br>-Voffset | V<P+1,N><br>-Voffset | V<P+2,N><br>-Voffset | ... | V<2P,N><br>-Voffset | ... | V<M-P+1,N><br>-Voffset | V<M-P+2,N><br>-Voffset | ... | V<M,N><br>-Voffset |

FIG.20A

| | \multicolumn{9}{c}{V (n)} | | | | | | | | |
|---|---|---|---|---|---|---|---|---|---|
| V (1) | 7 | 7 | 7 | 7 | 7 | 7 | 5 | 7 | 7 |
| V (2) | 7 | 5 | 5 | 5 | 5 | 5 | 5 | 5 | 7 |
| V (3) | 7 | 5 | 7 | 7 | 7 | 7 | 7 | 5 | 7 |
| V (4) | 7 | 5 | 7 | 7 | 7 | 7 | 7 | 5 | 7 |
| V (5) | 7 | 5 | 7 | 7 | 7 | 7 | 7 | 5 | 7 |
| V (6) | 7 | 5 | 7 | 5 | 5 | 7 | 7 | 5 | 7 |
| V (7) | 7 | 5 | 7 | 5 | 5 | 7 | 7 | 5 | 7 |
| V (8) | 7 | 5 | 7 | 7 | 7 | 7 | 7 | 5 | 7 |
| V (9) | 7 | 5 | 7 | 7 | 7 | 7 | 7 | 5 | 7 |
| V (10) | 7 | 5 | 7 | 7 | 7 | 7 | 7 | 5 | 7 |
| V (11) | 7 | 5 | 7 | 7 | 7 | 7 | 7 | 5 | 7 |
| V (12) | 7 | 5 | 5 | 5 | 5 | 5 | 5 | 5 | 7 |
| V (13) | 7 | 5 | 7 | 7 | 7 | 7 | 5 | 7 | 7 |
| V (14) | 10 | 10 | 10 | 10 | 10 | 10 | 10 | 10 | 10 |

FIG.20B

| V (n) | | | | | | | | | |
|---|---|---|---|---|---|---|---|---|---|
| V (1) | 10 | 10 | 10 | 10 | 10 | 10 | 10 | 10 | 10 |
| V (2) | 10 | 10 | 10 | 10 | 10 | 10 | 10 | 10 | 10 |
| V (3) | 10 | 10 | 10 | 10 | 10 | 10 | 10 | 10 | 10 |
| V (4) | 10 | 10 | 10 | 10 | 10 | 10 | 10 | 10 | 10 |
| V (5) | 10 | 10 | 10 | 10 | 10 | 10 | 10 | 10 | 10 |
| V (6) | 10 | 10 | 10 | 10 | 10 | 10 | 10 | 10 | 10 |
| V (7) | 10 | 10 | 10 | 10 | 10 | 10 | 10 | 10 | 10 |
| V (8) | 10 | 10 | 10 | 10 | 10 | 10 | 10 | 10 | 10 |
| V (9) | 10 | 10 | 10 | 10 | 10 | 10 | 10 | 10 | 10 |
| V (10) | 10 | 10 | 10 | 10 | 10 | 10 | 10 | 10 | 10 |
| V (11) | 10 | 10 | 10 | 10 | 10 | 10 | 10 | 10 | 10 |
| V (12) | 10 | 10 | 10 | 10 | 10 | 10 | 10 | 10 | 10 |
| V (13) | 10 | 10 | 10 | 10 | 10 | 10 | 10 | 10 | 10 |
| V (14) | 10 | 10 | 10 | 10 | 10 | 10 | 10 | 10 | 10 |

FIG.21

| | ΔV (n) | | | | | | | | |
|---|---|---|---|---|---|---|---|---|---|
| V (1)-V (2) | 0 | 2 | 2 | 2 | 2 | 2 | 2 | 2 | 0 |
| V (2)-V (3) | 0 | -2 | -2 | -2 | -2 | -2 | -2 | 0 | 0 |
| V (3)-V (4) | 0 | 0 | 0 | 0 | 0 | 0 | 0 | 0 | 0 |
| V (4)-V (5) | 0 | 0 | 0 | 0 | 0 | 0 | 0 | 0 | 0 |
| V (5)-V (6) | 0 | 0 | 2 | 2 | 0 | 0 | 0 | 0 | 0 |
| V (6)-V (7) | 0 | 0 | 0 | 0 | 0 | 0 | 0 | 0 | 0 |
| V (7)-V (8) | 0 | 0 | -2 | -2 | 0 | 0 | 0 | 0 | 0 |
| V (8)-V (9) | 0 | 0 | 0 | 0 | 0 | 0 | 0 | 0 | 0 |
| V (9)-V (10) | 0 | 0 | 0 | 0 | 0 | 0 | 0 | 0 | 0 |
| V (10)-V (11) | 0 | 0 | 0 | 0 | 0 | 0 | 0 | 0 | 0 |
| V (11)-V (12) | 0 | 0 | 2 | 2 | 2 | 2 | 2 | 0 | 0 |
| V (12)-V (13) | 0 | -2 | -2 | -2 | -2 | -2 | -2 | -2 | 0 |
| V (13)-V (14) | -3 | -5 | -3 | -3 | -3 | -3 | -5 | -3 | -3 |

FIG.22

| | V (n) | ΔV (n) | V (n)'=V (n+1)'+ΔV (n) |
|---|---|---|---|
| 1 | V (1) | V (1)-V (2) | V (1)'=V (2)'+ΔV (1)<br>=V (1)-Voffset |
| 2 | V (2) | V (2)-V (3) | V (2)'=V (3)'+ΔV (2)<br>=V (2)-Voffset |
| ⋮ | ⋮ | ⋮ | ⋮ |
| N-2 | V (N-2) | V (N-2)-V (N-1) | V (N-2)'=V (N-1)'+ΔV (N-2)<br>=V (N-2)-Voffset |
| N-1 | V (N-1) | V (N-1)-V (N) | V (N-1)'=V (N)'+ΔV (N-1)<br>=V (N-1)-Voffset |
| N | V (N) | V (N)-Voffset | V (N)'=V (N+1)'+ΔV (N)<br>=Null (=0)+ΔV (N)<br>=V (N)-Voffset |

FIG.23A

| | $V(n)'=V(n+1)'+\Delta V(n)$ | | | | | | | | |
|---|---|---|---|---|---|---|---|---|---|
| V(1)-V(14) | -3 | -3 | -3 | -3 | -3 | -3 | -5 | -3 | -3 |
| V(2)-V(14) | -3 | -5 | -5 | -5 | -5 | -5 | -5 | -5 | -3 |
| V(3)-V(14) | -3 | -5 | -3 | -3 | -3 | -3 | -3 | -5 | -3 |
| V(4)-V(14) | -3 | -5 | -3 | -3 | -3 | -3 | -3 | -5 | -3 |
| V(5)-V(14) | -3 | -5 | -3 | -3 | -3 | -3 | -3 | -5 | -3 |
| V(6)-V(14) | -3 | -5 | -3 | -5 | -5 | -3 | -3 | -5 | -3 |
| V(7)-V(14) | -3 | -5 | -3 | -5 | -5 | -3 | -3 | -5 | -3 |
| V(8)-V(14) | -3 | -5 | -3 | -3 | -3 | -3 | -3 | -5 | -3 |
| V(9)-V(14) | -3 | -5 | -3 | -3 | -3 | -3 | -3 | -5 | -3 |
| V(10)-V(14) | -3 | -5 | -3 | -3 | -3 | -3 | -3 | -5 | -3 |
| V(11)-V(14) | -3 | -5 | -3 | -3 | -3 | -3 | -3 | -5 | -3 |
| V(12)-V(14) | -3 | -5 | -5 | -5 | -5 | -5 | -5 | -5 | -3 |
| V(13)-V(14) | -3 | -5 | -3 | -3 | -3 | -3 | -5 | -3 | -3 |

FIG.23B

| V(n)'=V(n+1)'+ΔV(n) | | | | | | | | | |
|---|---|---|---|---|---|---|---|---|---|
| V(1)-V(13) | 0 | -2 | 0 | 0 | 0 | 0 | 0 | 0 | 0 |
| V(2)-V(13) | 0 | 0 | -2 | -2 | -2 | -2 | 0 | -2 | 0 |
| V(3)-V(13) | 0 | 0 | 0 | 0 | 0 | 0 | -2 | -2 | 0 |
| V(4)-V(13) | 0 | 0 | 0 | 0 | 0 | 0 | -2 | -2 | 0 |
| V(5)-V(13) | 0 | 0 | 0 | 0 | 0 | 0 | -2 | -2 | 0 |
| V(6)-V(13) | 0 | 0 | 0 | -2 | -2 | 0 | -2 | -2 | 0 |
| V(7)-V(13) | 0 | 0 | 0 | -2 | -2 | 0 | -2 | -2 | 0 |
| V(8)-V(13) | 0 | 0 | 0 | 0 | 0 | 0 | -2 | -2 | 0 |
| V(9)-V(13) | 0 | 0 | 0 | 0 | 0 | 0 | -2 | -2 | 0 |
| V(10)-V(13) | 0 | 0 | 0 | 0 | 0 | 0 | -2 | -2 | 0 |
| V(11)-V(13) | 0 | 0 | 0 | 0 | 0 | 0 | -2 | -2 | 0 |
| V(12)-V(13) | 0 | 0 | -2 | -2 | -2 | -2 | 0 | -2 | 0 |

FIG.26

| F/c | 1 | 2 | ... | P-1 | P | P+1 | P+2 | ... | 2P-1 | 2P | ... | M-P+1 | M-P+2 | ... | M-1 | M |
|---|---|---|---|---|---|---|---|---|---|---|---|---|---|---|---|---|
| 1 | A | B | ... | C | D | A | B | ... | C | D | ... | A | B | ... | C | D |
| 2 | E | F | ... | G | H | E | F | ... | G | H | ... | E | F | ... | G | H |
| ... | ... | ... | ... | ... | ... | ... | ... | ... | ... | ... | ... | ... | ... | ... | ... | ... |
| N | I | J | ... | K | L | I | J | ... | K | L | ... | I | J | ... | K | L |

FIG.27

| n\m | 1 | 2 | ... | P-1 | P | P+1 | P+2 | ... | 2P-1 | 2P | ... | M-P+1 | M-P+2 | ... | M-1 | M |
|---|---|---|---|---|---|---|---|---|---|---|---|---|---|---|---|---|
| 1 | V<1, 1><br>-V<2, 1> | V<2, 1><br>-V<3, 1> | ... | V<P-1, 1><br>-V<P, 1> | V<P, 1><br>-V<P+1, 1> | V<P+1, 1><br>-V<P+2, 1> | V<P+2, 1><br>-V<P+3, 1> | ... | V<2P-1, 1><br>-V<2P, 1> | V<2P, 1><br>-V<2P+1, 1> | ... | V<M-P+1, 1><br>-V<M-P+2, 1> | V<M-P+2, 1><br>-V<3, 1> | ... | V<M-1, 1><br>-V<M, 1> | V<M, 1><br>-Voffset |
| 2 | V<1, 2><br>-V<2, 2> | V<2, 2><br>-V<3, 2> | ... | V<P-1, 2><br>-V<P, 2> | V<P, 2><br>-V<P+1, 2> | V<P+1, 2><br>-V<P+2, 2> | V<P+2, 2><br>-V<P+3, 2> | ... | V<2P-1, 2><br>-V<2P, 2> | V<2P, 2><br>-V<2P+1, 2> | ... | V<M-P+1, 2><br>-V<M-P+2, 2> | V<M-P+2, 2><br>-V<3, 2> | ... | V<M-1, 2><br>-V<M, 2> | V<M, 2><br>-Voffset |
| ... | ... | ... | ... | ... | ... | ... | ... | ... | ... | ... | ... | ... | ... | ... | ... | ... |
| N | V<1, N><br>-V<2, N> | V<2, N><br>-V<3, N> | ... | V<P-1, N><br>-V<P, N> | V<P, N><br>-V<P+1, N> | V<P+1, N><br>-V<P+2, N> | V<P+2, N><br>-V<P+3, N> | ... | V<2P-1, N><br>-V<2P, N> | V<2P, N><br>-V<2P+1, N> | ... | V<M-P+1, N><br>-V<M-P+2, N> | V<M-P+2, N><br>-V<M-P+3, N> | ... | V<M-1, N><br>-V<M, N> | V<M, N><br>-Voffset |

FIG.28

| | V(1) | V(2) | V(3) | V(4) | V(5) | V(6) | V(7) | V(8) | V(9) | V(10) |
|---|---|---|---|---|---|---|---|---|---|---|
| V(m) | 7 | 7 | 7 | 7 | 7 | 7 | 5 | 7 | 7 | 10 |
| | 7 | 5 | 5 | 5 | 5 | 5 | 5 | 5 | 7 | 10 |
| | 7 | 5 | 7 | 7 | 7 | 7 | 7 | 5 | 7 | 10 |
| | 7 | 5 | 7 | 7 | 7 | 7 | 7 | 5 | 7 | 10 |
| | 7 | 5 | 7 | 7 | 7 | 7 | 7 | 5 | 7 | 10 |
| | 7 | 5 | 7 | 5 | 5 | 7 | 7 | 5 | 7 | 10 |
| | 7 | 5 | 7 | 5 | 5 | 7 | 7 | 5 | 7 | 10 |
| | 7 | 5 | 7 | 7 | 7 | 7 | 7 | 5 | 7 | 10 |
| | 7 | 5 | 7 | 7 | 7 | 7 | 7 | 5 | 7 | 10 |
| | 7 | 5 | 7 | 7 | 7 | 7 | 7 | 5 | 7 | 10 |
| | 7 | 5 | 7 | 7 | 7 | 7 | 7 | 5 | 7 | 10 |
| | 7 | 5 | 5 | 5 | 5 | 5 | 5 | 5 | 7 | 10 |
| | 7 | 5 | 7 | 7 | 7 | 7 | 5 | 7 | 7 | 10 |

FIG.30

| | 1 | 2 | ... | M-2 | M-1 | M |
|---|---|---|---|---|---|---|
| V(m) | V(1) | V(2) | ... | V(M-2) | V(M-1) | V(M) |
| ΔV(m) | V(1)-V(2) | V(2)-V(3) | ... | V(M-2)-V(M-1) | V(M-1)-V(M) | V(M)-Voffset |
| V(m)'=V(m+1)'+ΔV(m) | V(1)'=V(2)'+ΔV(1)<br>=V(1)-Voffset | V(2)'=V(3)'+ΔV(2)<br>=V(2)-Voffset | ... | V(M-2)'=V(M-1)'+ΔV(M-2)<br>=V(M-2)-Voffset | V(M-1)'=V(M)'+ΔV(M-1)<br>=V(M-1)-Voffset | V(M)'=V(M+1)'+ΔV(M)<br>=Null(=0)+ΔV(M)<br>=V(M)-Voffset |

FIG.31

| V(1)-V(10) | V(2)-V(10) | V(3)-V(10) | V(4)-V(10) | V(5)-V(10) | V(6)-V(10) | V(7)-V(10) | V(8)-V(10) | V(9)-V(10) |
|---|---|---|---|---|---|---|---|---|
| -3 | -3 | -3 | -3 | -3 | -3 | -5 | -3 | -3 |
| -3 | -5 | -5 | -5 | -5 | -5 | -5 | -5 | -3 |
| -3 | -5 | -3 | -3 | -3 | -3 | -3 | -5 | -3 |
| -3 | -5 | -3 | -5 | -5 | -3 | -3 | -5 | -3 |
| -3 | -5 | -3 | -5 | -5 | -3 | -3 | -5 | -3 |
| -3 | -5 | -3 | -3 | -3 | -3 | -3 | -5 | -3 |
| -3 | -5 | -3 | -3 | -3 | -3 | -3 | -5 | -3 |
| -3 | -5 | -3 | -3 | -3 | -3 | -3 | -5 | -3 |
| -3 | -5 | -5 | -5 | -5 | -5 | -5 | -5 | -3 |
| -3 | -3 | -3 | -3 | -3 | -3 | -5 | -3 | -3 |

$V(m)' = V(m+1)' + \Delta V(m)$

DETECTION DEVICE

CROSS-REFERENCE TO RELATED APPLICATION

This application claims the benefit of priority from Japanese Patent Application No. 2021-192137 filed on Nov. 26, 2021, the entire contents of which are incorporated herein by reference.

BACKGROUND

1. Technical Field

The present disclosure relates to a detection device.

2. Description of the Related Art

In recent years, optical biometric sensors have become known as biometric sensors used for personal authentication and other purposes. Fingerprint sensors (refer to, for example, U.S. Unexamined Patent Application Publication No. 2018/0012069 (US-A-2018/0012069)) and vein sensors are known as biometric sensors. In the fingerprint sensors described in US-A-2018/0012069, a plurality of photoelectric conversion elements such as photodiodes are arranged on a semiconductor substrate. An output signal of the photoelectric conversion element changes in accordance with an amount of light to be irradiated.

For example, when detecting, asperities on a surface of an object to be detected such as a fingerprint or a vein inside a finger, and the like, if an amplification of an analog stage is increased to detect slight differences in the signals output from each photoelectric conversion element, a data overflow may occur in a subsequent digital processing process to prevent good detection.

It is an object of the present disclosure to provide a detection device capable of improving detection accuracy without causing data overflow.

SUMMARY

A detection device according to an embodiment of the present disclosure includes a sensor area in which a plurality of detection elements including photoelectric conversion elements are arranged in a matrix having a row-column configuration within a detection region, and a detector configured to calculate a detection value corresponding to the detection elements based on a voltage generated in the detection elements. In the detection region of the sensor area, number of detection elements arranged in a first direction is M, and number of detection elements arranged in a second direction different from the first direction is N, and the detector regards a potential difference $\Delta V\langle m,n\rangle$ between a voltage $V\langle m,n\rangle$ of the detection element in an m-th column and an n-th row arranged in the m-th column (m is a natural number less than or equal to M) in the first direction and arranged in the n-th row (n is a natural number less than or equal to N) in the second direction, and a voltage $V\langle m,n+1\rangle$ of the detection element in the m-th column and an n+1-th row arranged in the m-th column in the first direction and arranged in the n+1-th row in the second direction, as a first detection value corresponding to the detection element in the m-th column and n-th row, and calculates a second detection value $V\langle m,n\rangle'$ corresponding to the detection element in the m-th column and n-th row using the following equations (1) and (2):

$$V\langle m,n\rangle' = V\langle m,n+1\rangle' + \Delta V\langle m,n\rangle \quad (1)$$

$$V\langle m,N+1\rangle' = 0 \quad (2).$$

A detection device according to an embodiment of the present disclosure includes a sensor area in which a plurality of detection elements including photoelectric conversion elements are arranged in a matrix having a row-column configuration within a detection region, and a detector configured to calculate a detection value corresponding to the detection elements based on a voltage generated in the detection elements. In the detection region of the sensor area, number of detection elements arranged in a first direction is M, and number of detection elements arranged in a second direction different from the first direction is N, and the detector regards a potential difference $\Delta V\langle m,n\rangle$ between a voltage $V\langle m,n\rangle$ of the detection element in an m-th column and an n-th row arranged in the m-th column (m is a natural number less than or equal to M) in the first direction and arranged in the n-th row (n is a natural number less than or equal to N) in the second direction, and a voltage $V\langle m+1,n\rangle$ of the detection element in an m+1-th column and the n-th row arranged in the m+1-th column in the first direction and arranged in the n-th row in the second direction, as a first detection value corresponding to the detection element in the m-th column and n-th row, and calculates a second detection value $V\langle m,n\rangle'$ corresponding to the detection element in the m-th column and n-th row using the following equations (3) and (4):

$$V\langle m,n\rangle' = V\langle m+1,n\rangle' + \Delta V\langle m,n\rangle \quad (3)$$

$$V\langle M+1,n\rangle' = 0 \quad (4).$$

BRIEF DESCRIPTION OF THE DRAWINGS

FIG. 9 is a diagram illustrating an example of digital data acquired during the detection operation of the detection device according to the comparative example;

FIG. 14 is a diagram illustrating a correspondence relationship of digital data acquired at each sampling timing of the timing chart illustrated in FIG. 13;

FIG. 15 is a diagram illustrating an example of digital data acquired during the detection operation of the detection device according to the first embodiment;

FIG. 18 is a diagram illustrating a correspondence relationship of digital data acquired at each sampling timing of the timing chart illustrated in FIG. 17;

FIG. 19 is a diagram illustrating an example of digital data acquired during the detection operation of the signal line selection circuit and the detection circuit according to the first embodiment;

FIG. 20A is a schematic diagram illustrating an example of detection values for each detection element;

FIG. 20B is a schematic diagram illustrating an example of pre-exposure values of the detection values illustrated in FIG. 20A;

FIG. 21 is a schematic diagram illustrating difference values between the detection values of the detection elements adjacent to each other in the column direction illustrated in FIG. 20A;

FIG. 22 is a diagram explaining image decoding processing in the detection device according to the first embodiment;

FIG. 23A is a schematic diagram illustrating the detection values after image decoding by the detection device according to the first embodiment;

FIG. 23B is a schematic diagram illustrating the detection values after image decoding when no offset voltage is defined;

FIG. 26 is a diagram illustrating a correspondence relationship of digital data acquired at each sampling timing of the timing chart illustrated in FIG. 25;

FIG. 27 is a diagram illustrating an example of digital data acquired during the detection operation of the signal line selection circuit and the detection circuit according to the second embodiment;

FIG. 28 is a schematic diagram illustrating an example of detection values for each detection element;

FIG. 30 is a diagram explaining image decoding processing in the detection device according to the second embodiment; and FIG. 31 is a schematic diagram illustrating the detection values after image decoding by the detection device according to the second embodiment.

DETAILED DESCRIPTION

Figure 1:
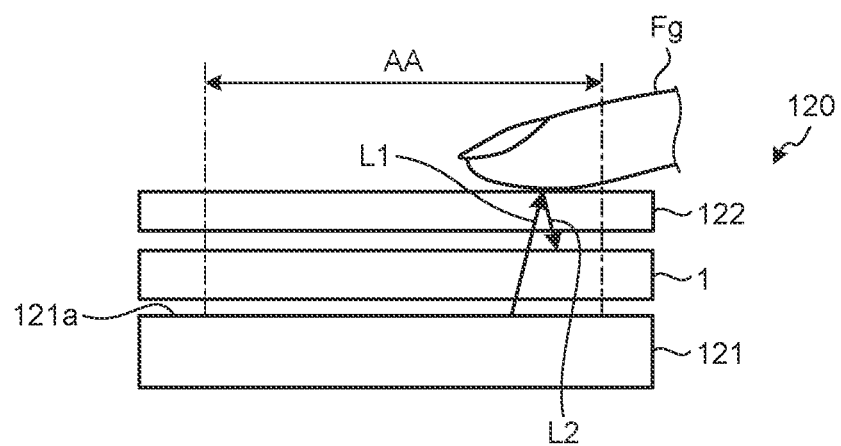
FIG. 1 is a sectional view illustrating a schematic sectional configuration of a detection apparatus having an illumination device, the detection apparatus including a detection device according to an embodiment of the present disclosure.

The following describes modes (embodiments) for carrying out the present disclosure in detail with reference to the drawings. The present disclosure is not limited to the description of the embodiment to be given below. Components to be described below include those easily conceivable by those skilled in the art or those substantially identical thereto. In addition, the components to be described below can be combined as appropriate. What is disclosed herein is merely an example, and the present disclosure naturally encompasses appropriate modifications easily conceivable by those skilled in the art while maintaining the gist of the disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

FIG. 1 is a sectional view illustrating a schematic sectional configuration of a detection apparatus having an illumination device, the detection apparatus including a detection device according to an embodiment. As illustrated in FIG. 1, a detection apparatus 120 having an illumination device includes a detection device 1, an illumination device 121, and a cover glass 122. The illumination device 121, the detection device 1, and the cover glass 122 are stacked in this order in a direction orthogonal to a surface of the detection device 1. In the present disclosure, the detection device 1 is an optical sensor that detects a finger Fg according to an amount of light to be received.

The illumination device 121 has a light-emitting surface 121a for emitting light, and emits light L1 from the light-emitting surface 121a toward the detection device 1. The illumination device 121 is a backlight. The illumination device 121 may be, for example, what is called a side light-type backlight that includes a light guide plate provided in a position corresponding to a detection region AA and a plurality of light sources arranged at one end or both ends of the light guide plate. For example, light-emitting diodes (LEDs) for emitting light in a predetermined color are used as the light sources. The illumination device 121 may be what is called a direct-type backlight that includes the light sources (such as the LEDs) provided directly below the detection region AA. The illumination device 121 is not limited to the backlight, and may be provided on a lateral side or an upper side of the detection device 1, and may emit the light L1 from the lateral side or the upper side of a finger Fg.

The detection device 1 is provided so as to face the light-emitting surface 121a of the illumination device 121. The light L1 emitted from the illumination device 121 passes through the detection device 1 and the cover glass 122. The detection device 1 is, for example, a light-reflective biometric sensor, and can detect asperities (such as a fingerprint) on a surface of the finger Fg by detecting light L2 reflected on the surface of the finger Fg. Alternatively, the detection device 1 may detect information on a living body by detecting the light L2 reflected inside the finger Fg in addition to detecting the fingerprint. Examples of the information on the living body include a blood vessel image, pulsation, and a pulse wave of, for example, a vein. The color of the light L1 from the illumination device 121 may be varied according to a detection target.

The cover glass 122 is a member for protecting the detection device 1 and the illumination device 121, and covers the detection device 1 and the illumination device 121. The cover glass 122 is, for example, a glass substrate. The cover glass 122 is not limited to a glass substrate, and may be, for example, a resin substrate. The cover glass 122 need not be provided. In this case, the surface of the detection device 1 is provided with a protective layer, and the finger Fg contacts the protective layer of the detection device 1.

The detection apparatus 120 having an illumination device may be provided with a display panel instead of the illumination device 121. The display panel may be, for example, an organic electroluminescent (EL) display panel (organic light-emitting diode (OLED)) or an inorganic EL display (micro-LED or mini-LED) panel. Alternatively, the display panel may be a liquid crystal display (LCD) panel using liquid crystal elements as display elements or an electrophoretic display (EPD) panel using electrophoretic elements as display elements. Also, in this case, display light emitted from the display panel passes through the detection device 1, and the fingerprint of the finger Fg and the information on the living body can be detected based on the light L2 reflected by the finger Fg.

Figure 2:
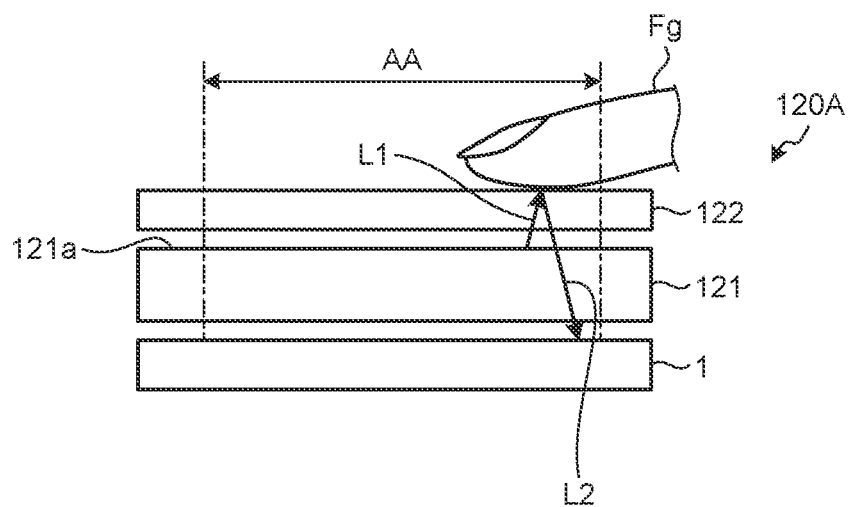
FIG. 2 is a sectional view illustrating a schematic sectional configuration of a detection apparatus having an illumination device according to a modification.

FIG. 2 is a sectional view illustrating a schematic sectional configuration of a detection apparatus having an illumination device according to a modification. As illustrated in FIG. 2, in the detection apparatus 120 having an illumination device, the detection device 1, the illumination device 121, the cover glass 122 are stacked in this order in the direction orthogonal to the surface of the detection device 1. Also, in the present modification, a display panel such as an organic EL display panel can be employed as the illumination device 121.

The light L1 emitted from the illumination device 121 passes through the cover glass 122, and then, is reflected by the finger Fg. Light L2 reflected by the finger Fg passes through the cover glass 122, and further passes through the illumination device 121. The detection device 1 can perform the detection of the information on the living body such as the fingerprint detection by receiving the light L2 that has passed through the illumination device 121.

Figure 3:
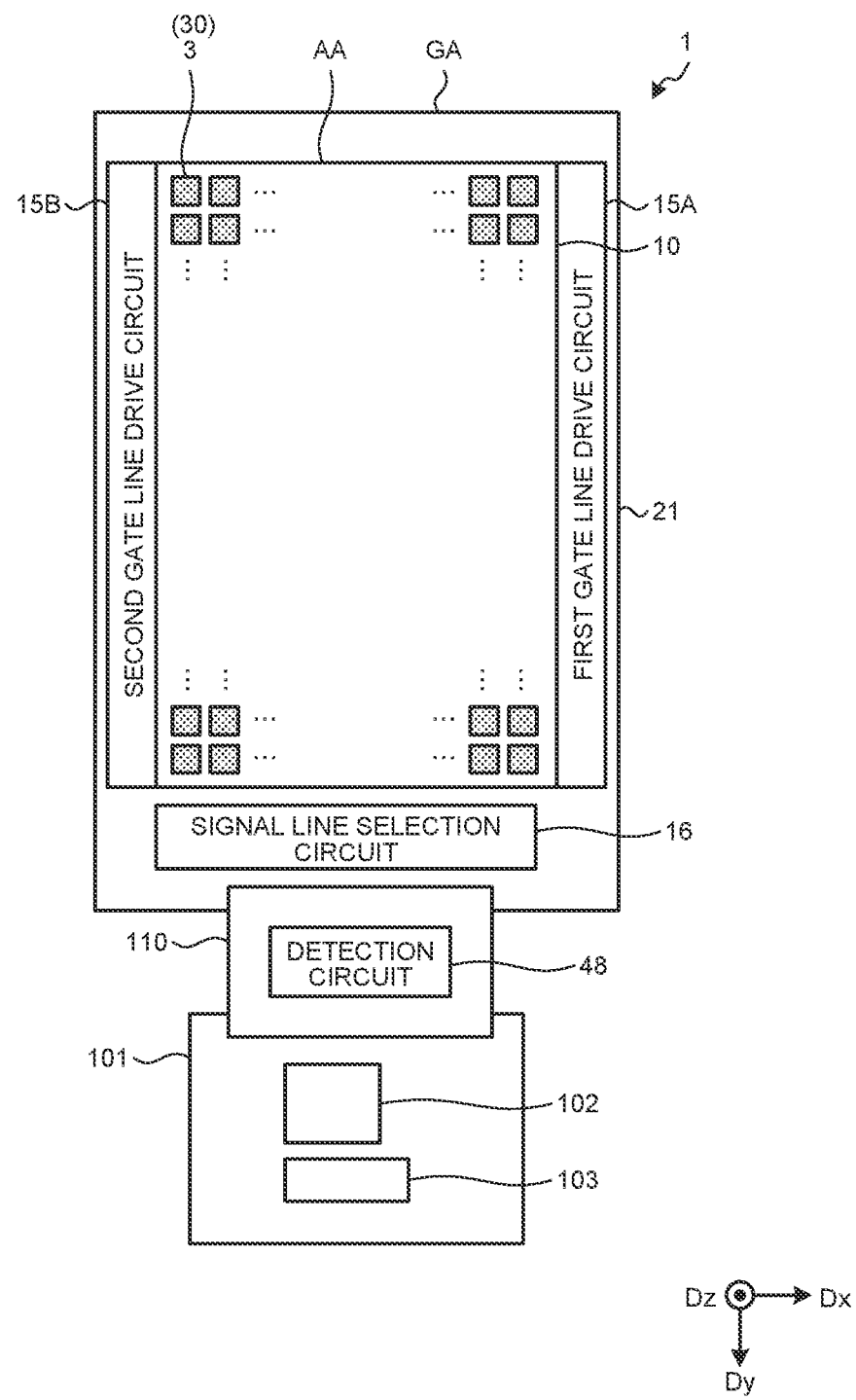
FIG. 3 is a plan view illustrating the detection device according to the embodiment.

FIG. 3 is a plan view illustrating the detection device according to the embodiment. As illustrated in FIG. 3, the detection device 1 includes a substrate 21, a sensor area 10, a first gate line drive circuit 15A, a second gate line drive circuit 15B, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor area 10, the first gate line drive circuit 15A, the second gate line drive circuit 15B, and the signal line selection circuit 16 to control a detection operation of the sensor area 10. The power supply circuit 103 supplies voltage signals including, for example, a power supply voltage Vsf and a common voltage Vcom (refer to FIG. 5) to the sensor area 10, the first gate line drive circuit 15A, the second gate line drive circuit 15B, and the signal line selection circuit 16.

The substrate 21 has the detection region AA and a peripheral region GA. The detection region AA is a region overlapping a plurality of detection elements 3 included in the sensor area 10. The peripheral region GA is a region outside the detection region AA, and is a region not overlapping the detection elements 3. That is, the peripheral region GA is a region between the outer perimeter of the detection region AA and the ends of the substrate 21. The first gate line drive circuit 15A, the second gate line drive circuit 15B, and the signal line selection circuit 16 are provided in the peripheral region GA.

Each of the detection elements 3 of the sensor area 10 is a photosensor including a photoelectric conversion element 30. The photoelectric conversion element 30 is a photodiode, and outputs an electrical signal corresponding to light irradiating each of the photoelectric conversion elements 30. More specifically, the photoelectric conversion element 30 is a positive-intrinsic-negative (PIN) photodiode. The detection elements 3 are arranged in a matrix having a row-column configuration in the detection region AA. The photoelectric conversion element 30 included in each of the detection elements 3 performs the detection according to a gate drive signal (for example, a reset control signal RST or a read control signal RD) supplied from the first gate line drive circuit 15A or the second gate line drive circuit 15B. Each of the photoelectric conversion elements 30 outputs the electrical signal corresponding to the light irradiating the photoelectric conversion element 30 as a detection signal Vdet to the signal line selection circuit 16. The detection device 1 detects the information on the living body based on the detection signals Vdet received from the detection elements 3.

The first gate line drive circuit 15A, the second gate line drive circuit 15B, and the signal line selection circuit 16 are provided in the peripheral region GA. Specifically, the first gate line drive circuit 15A and the second gate line drive circuit 15B are provided in regions extending along a second direction Dy in the peripheral region GA. The signal line selection circuit 16 is provided in a region extending along a first direction Dx in the peripheral region GA, and is provided between the sensor area 10 and the detection circuit 48. The first gate line drive circuit 15A and the second gate line drive circuit 15B are arranged with the detection region AA interposed therebetween in the first direction Dx. The first gate line drive circuit 15A and the second gate line drive circuit 15B are not limited to this configuration, and may be formed as one circuit and arranged along one side of the detection region AA.

The first direction Dx is one direction in a plane parallel to the substrate 21. The second direction Dy is one direction in the plane parallel to the substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the substrate 21.

The number of detection elements 3 arranged in the first direction Dx in the detection region AA is, for example, 1080. The number of detection elements 3 arranged in the second direction Dy in the detection region AA is, for example, 2340. In this case, the detection region AA has 2340 element rows in which 1080 detection elements 3 are arranged in the first direction Dx are arranged in the second direction Dy. In other words, the detection region AA has 1080 element columns in which 2340 detection elements 3 are arranged in the second direction Dy are arranged in the first direction Dx.

Figure 4:
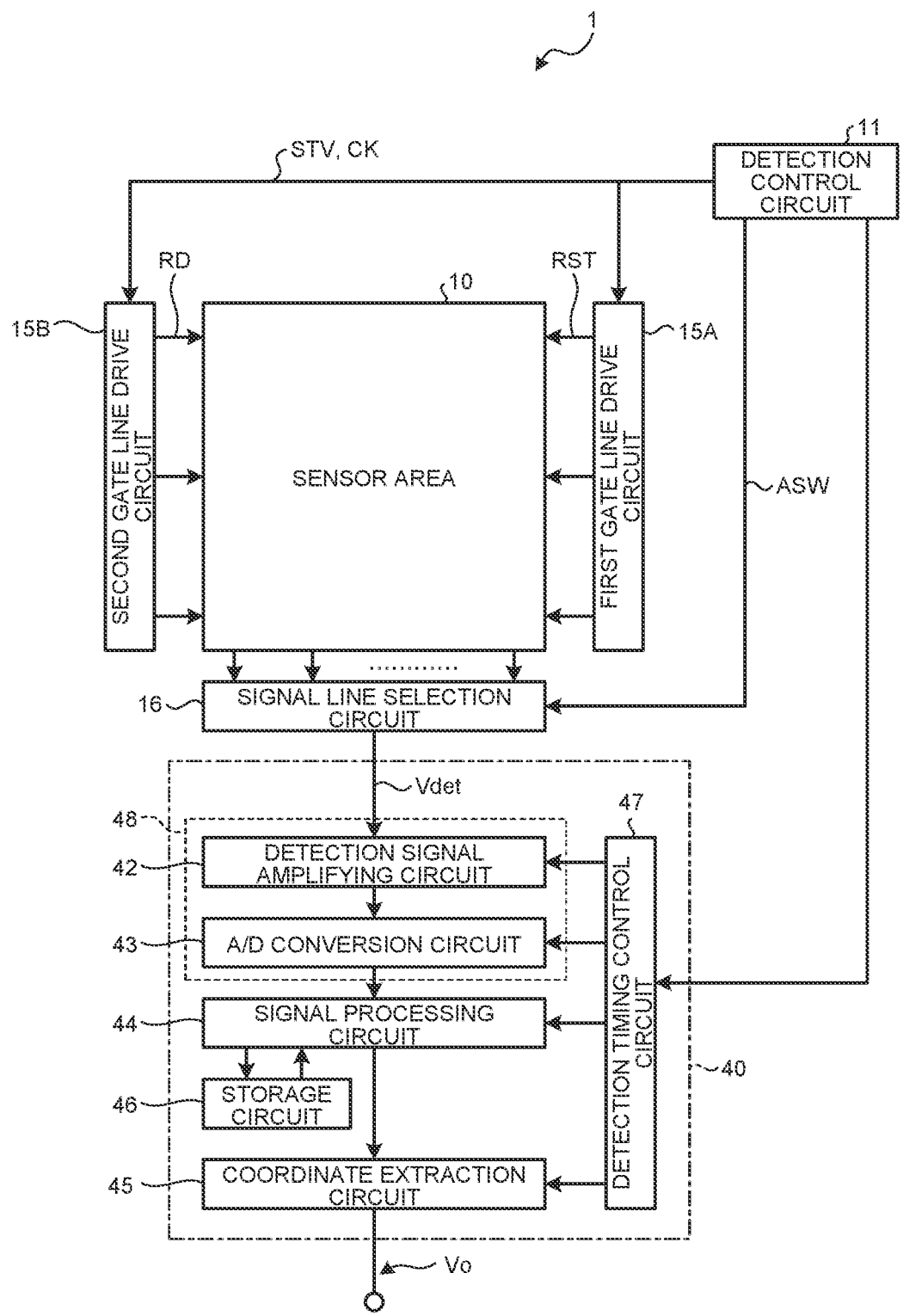
FIG. 4 is a block diagram illustrating a configuration example of the detection device according to the embodiment.

FIG. 4 is a block diagram illustrating a configuration example of the detection device according to the embodiment. As illustrated in FIG. 4, the detection device 1 further includes a detection control circuit 11 and a detector (a detection processing circuit) 40. Some or all functions of the detection control circuit 11 are included in the control circuit 102. Some or all functions of the detector 40 other than those of the detection circuit 48 are also included in the control circuit 102.

The detection control circuit 11 is a circuit that supplies respective control signals to the first gate line drive circuit 15A, the second gate line drive circuit 15B, the signal line selection circuit 16, and the detector 40 to control operations thereof. The detection control circuit 11 supplies various control signals including, for example, a synchronization signal STV and a clock signal CK to the first gate line drive circuit 15A and the second gate line drive circuit 15B. The detection control circuit 11 also supplies various control signals including, for example, a signal line selection signal ASW to the signal line selection circuit 16 during a detection period for performing detection processing. In the present disclosure, the detection control circuit 11 also supplies, through a detection timing control circuit 47, which will be described later, various control signals including, for example, a differential input switching signal SSW to the detection circuit 48 during the detection period for performing detection processing.

The first gate line drive circuit 15A and the second gate line drive circuit 15B are circuits that drive a plurality of gate lines (read control scan lines GLrd and reset control scan lines GLrst (refer to FIG. 5)) based on the various control signals. The first gate line drive circuit 15A and the second gate line drive circuit 15B sequentially or simultaneously select the gate lines, and supply the gate drive signals (for example, the reset control signals RST or the read control signals RD) to the selected gate lines. Through this operation, the first gate line drive circuit 15A and the second gate line drive circuit 15B select the photoelectric conversion elements 30 coupled to the gate lines.

Figure 5:
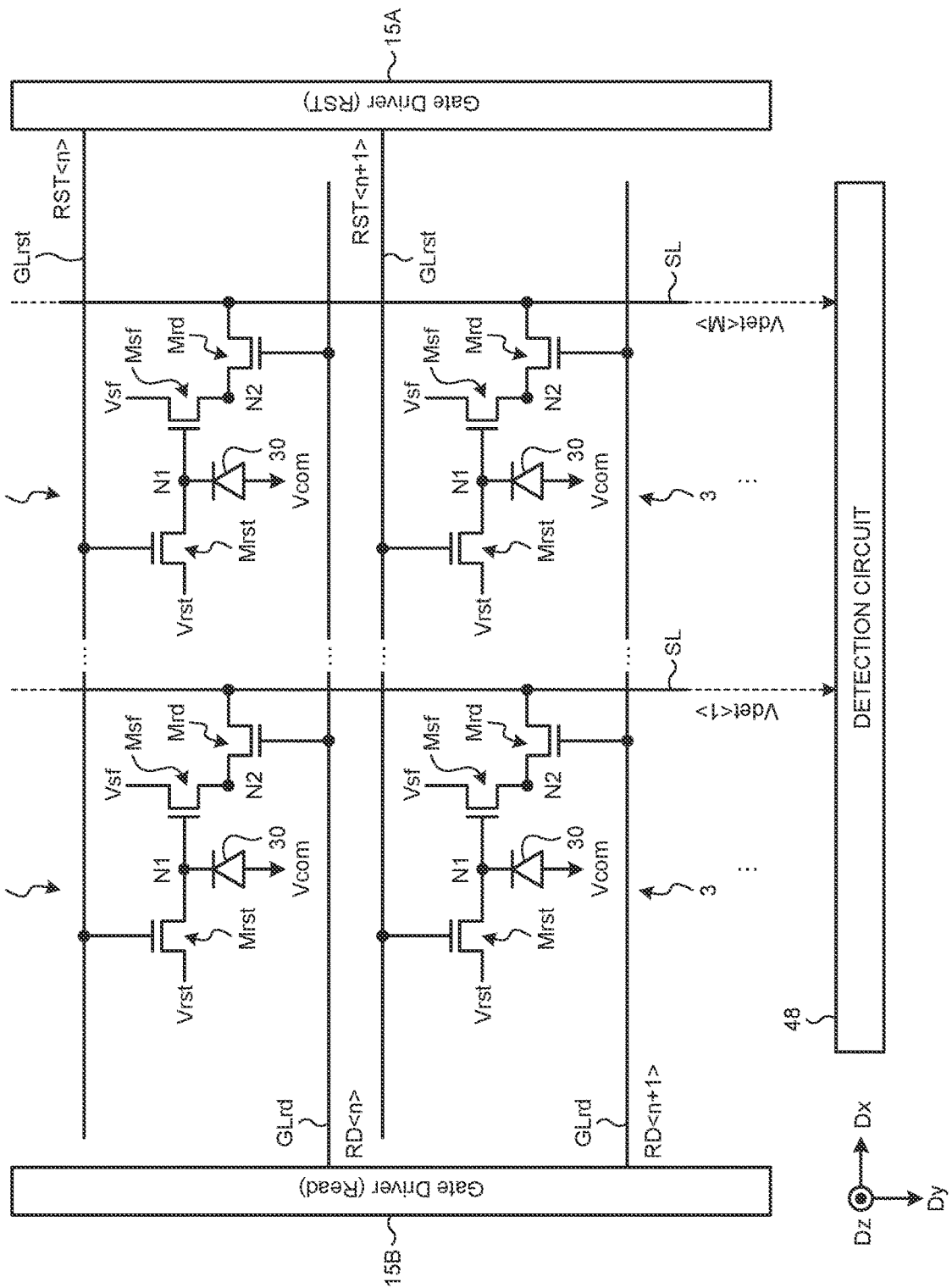
FIG. 5 is a circuit diagram illustrating a plurality of detection elements.

The signal line selection circuit 16 is a switch circuit that sequentially or simultaneously selects a plurality of output signal lines SL (refer to FIG. 5). The signal line selection circuit 16 is, for example, a multiplexer. The signal line selection circuit 16 electrically couples the selected output signal lines SL to the detection circuit 48 based on the signal line selection signal ASW supplied from the detection control circuit 11. Through this operation, the signal line selection circuit 16 outputs the detection signal Vdet from the detection element 3 to the detector 40. The signal line selection circuit 16 may be omitted. In this case, the output signal lines SL may be directly coupled to the detection circuit 48.

The detector 40 includes the detection circuit 48, a signal processing circuit 44, a coordinate extraction circuit 45, a storage circuit 46, and a detection timing control circuit 47.

In the present disclosure, the detector 40 is a circuit that detects biometric information of asperities on the surface of the object to be detected, a vein inside the finger, and the like such as the fingerprint of the finger Fg based on a control signal supplied from the detection control circuit 11 and the detection signal Vdet supplied from the detection element 3.

The detection timing control circuit 47 performs control to cause the detection circuit 48, the signal processing circuit 44, and the coordinate extraction circuit 45 to operate in synchronization with one another based on the control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet. The A/D conversion circuit 43 converts an analog signal output from the detection signal amplifying circuit 42 into a digital signal. In the present disclosure, the detection signal amplifying circuit 42 of the detection circuit 48 is an analog circuit that includes a differential amplifying circuit, which will be described later, and a subsequent circuit of the A/D conversion circuit 43 is a digital signal processing circuit that processes digital data digitally converted by the A/D conversion circuit 43.

The signal processing circuit 44 is a logic circuit that detects a predetermined physical quantity received by the sensor area 10 based on output signals of the detection circuit 48. The signal processing circuit 44 performs predetermined processing on the output signal of the detection circuit 48.

The storage circuit 46 temporarily stores therein signals calculated by the signal processing circuit 44. The storage circuit 46 may be, for example, a random-access memory (RAM) or a register circuit.

The coordinate extraction circuit 45 is, for example, a logic circuit that also obtains detected coordinates of the asperities on the surface of the object to be detected such as the finger Fg. Specifically, the coordinate extraction circuit 45 generates, for example, two-dimensional information (for example, image) indicating the shape of the asperities on the surface of the object to be detected such as the finger Fg. For example, in an aspect of the present disclosure, the coordinate extraction circuit 45 may obtain the detected coordinates of the finger Fg or the blood vessels of the palm.

The following describes a circuit configuration example and an operation example of the detection device 1. FIG. 5 is a circuit diagram illustrating the detection elements. As illustrated in FIG. 5, each of the detection elements 3 includes the photoelectric conversion element 30, a reset transistor Mrst, a read transistor Mrd, and a source follower transistor Msf. The detection elements 3 are provided with the reset control scan lines GLrst and the read control scan lines GLrd as detection drive lines (gate lines), and provided with the output signal lines SL as wiring for reading signals.

The reset control scan lines GLrst, the read control scan lines GLrd, and the output signal lines SL are each coupled to the detection elements 3. Specifically, the reset control scan lines GLrst and the read control scan lines GLrd extend in the first direction Dx (refer to FIG. 3), and are each coupled to the detection elements 3 arranged in the first direction Dx. The output signal lines SL extend in the second direction Dy, and are coupled to the detection elements 3 arranged in the second direction Dy. The output signal lines SL are wiring from which signals from the transistors (read transistors Mrd and source follower transistors Msf) are output.

The reset transistor Mrst, the read transistor Mrd, and the source follower transistor Msf are provided correspondingly to each of the photoelectric conversion elements 30. Each of the transistors included in the detection element 3 is constituted by an n-type thin-film transistor (TFT). However, each of the transistors is not limited thereto, and may be constituted by a p-type TFT.

The common voltage Vcom is applied to an anode of the photoelectric conversion element 30. A cathode of the photoelectric conversion element 30 is coupled to a node N1. The node N1 is coupled to one of the source and the drain of the reset transistor Mrst, and to the gate of the source follower transistor Msf. When light irradiates the photoelectric conversion element 30, a signal (electric charge) output from the photoelectric conversion element 30 is stored in a capacitive element generated at the node N1.

The gate of the reset transistor Mrst is coupled to a corresponding one of the reset control scan lines GLrst. The other of the source and the drain of the reset transistor Mrst is supplied with a reset voltage Vrst. When the reset transistor Mrst is turned on (into a conduction state) in response to the reset control signal RST supplied from the first gate line drive circuit 15A, the voltage of the node N1 is reset to the reset voltage Vrst. The common voltage Vcom has a voltage lower than the reset voltage Vrst, and the photoelectric conversion element 30 is driven in a reverse bias state.

The source follower transistor Msf is coupled between a terminal supplied with the power supply voltage Vsf and the read transistor Mrd (node N2). The gate of the source follower transistor Msf is coupled to the node N1. The gate of the source follower transistor Msf is supplied with a signal (voltage) corresponding to the signal (electric charge) generated by the photoelectric conversion element 30. This operation causes the source follower transistor Msf to output a signal voltage corresponding to the signal (electric charge) generated by the photoelectric conversion element 30 to the read transistor Mrd.

The read transistor Mrd is coupled between the source of the source follower transistor Msf (node N2) and a corresponding one of the output signal lines SL. The gate of the read transistor Mrd is coupled to a corresponding one of the read control scan lines GLrd. When the read transistor Mrd is turned on in response to the read control signal RD supplied from the second gate line drive circuit 15B, the signal output from the source follower transistor Msf, that is, the signal (voltage) corresponding to the signal (electric charge) generated by the photoelectric conversion element 30 is output as the detection signal Vdet to the output signal line SL.

In FIG. 5, the reset transistor Mrst and the read transistor Mrd each have a single-gate structure. However, the reset transistor Mrst and the read transistor Mrd may each have what is called a double-gate structure constituted by two transistors coupled in series, or may be have a configuration constituted by three or more transistors coupled in series. The circuit of each of the detection elements 3 is not limited to the configuration including the three transistors of the reset transistor Mrst, the source follower transistor Msf, and the read transistor Mrd. The detection element 3 may have two transistors or four or more transistors.

Figure 6:
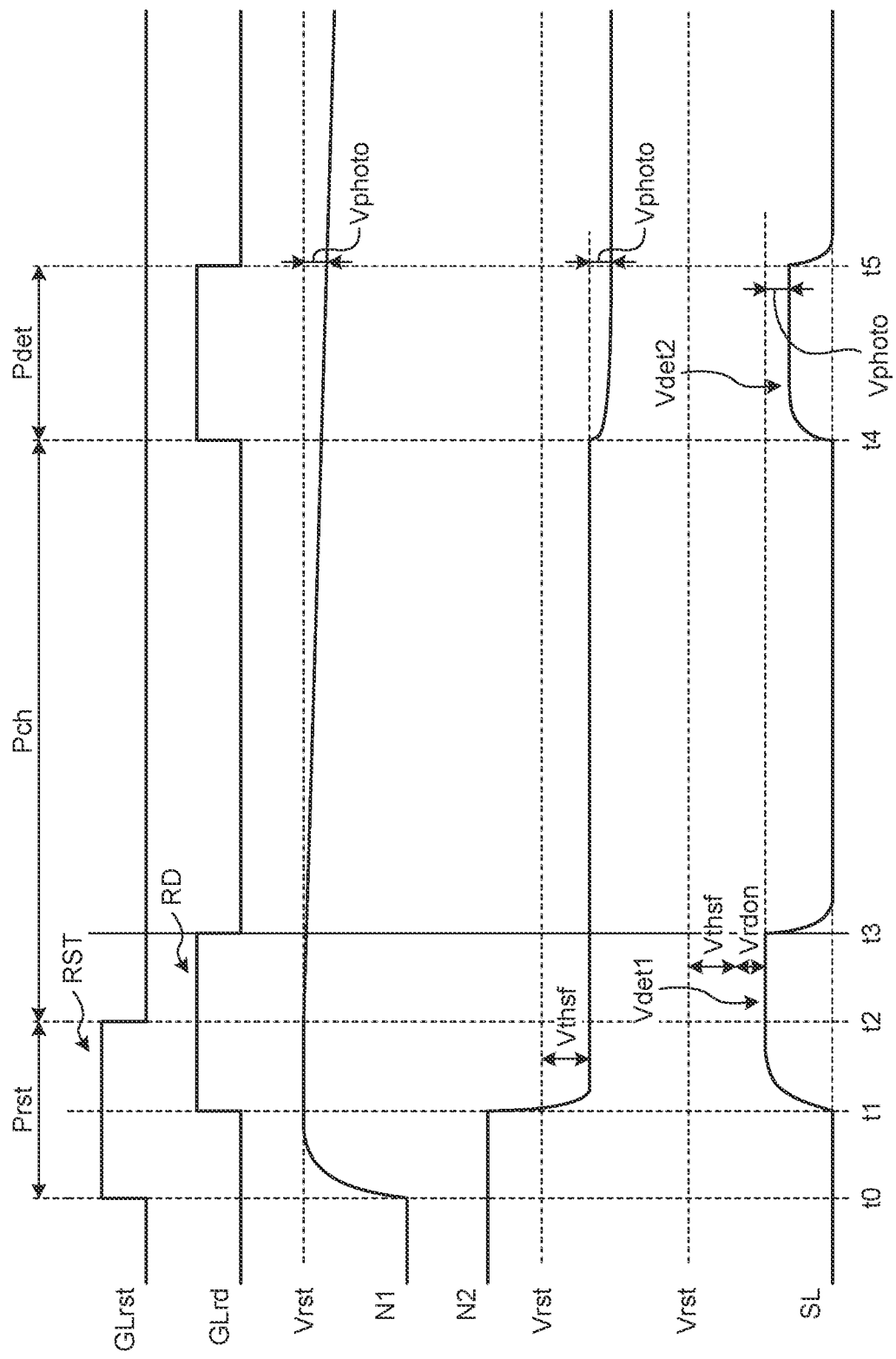
FIG. 6 is a timing waveform diagram illustrating an operation example of the detection element in a detection period.

FIG. 6 is a timing waveform diagram illustrating an operation example of the detection element in the detection period. As illustrated in FIG. 6, the detection element 3 performs the detection in the order of a reset period Prst, an exposure period Pch, and a read period Pdet during the detection period. The power supply circuit 103 supplies the common voltage Vcom to the anode of the photoelectric conversion element 30 over the reset period Prst, the exposure period Pch, and the read period Pdet.

At time t0, the detection control circuit 11 sets the reset control signal RST supplied to the reset control scan line GLrst to HIGH (high-level voltage) to start the reset period Prst. In the reset period Prst, the reset transistor Mrst is turned on (into the conduction state) to increase the voltage of the node N1 to the reset voltage Vrst. As a result, the photoelectric conversion element 30 is reverse biased by a potential difference between the reset voltage Vrst and the common voltage Vcom. The read transistor Mrd is off (into a nonconduction state). Hence, the source of the source follower transistor Msf is charged by the power supply voltage Vsf to increase the voltage of the node N2.

At time t1, the detection control circuit 11 sets the read control signal RD supplied to the read control scan line GLrd to HIGH (high-level voltage). As a result, the read transistor Mrd is turned on (into the conduction state) to set the voltage of the node N2 to (Vrst−Vthsf). Vthsf denotes a threshold voltage Vthsf of the source follower transistor Msf.

At time t2, the detection control circuit 11 sets the reset control signal RST to LOW (low-level voltage) to end the reset period Prst and start the exposure period Pch. In the exposure period Pch, the reset transistor Mrst is turned off (into the nonconduction state). The signal corresponding to the light irradiating the photoelectric conversion element 30 is stored to reduce the voltage of the node N1 to (Vrst−Vphoto). Specifically, during the reset period Prst, for example, the electric charge stored in the self-capacitance or capacitance not illustrated in the figure inside the photoelectric conversion element 30 is discharged by light irradiation, and a signal corresponding to the irradiated light is stored. Vphoto denotes a signal (voltage change amount) corresponding to the light irradiating the photoelectric conversion element 30.

At time t3, the voltage of a detection signal Vdet1 output from the output signal line SL is set to (Vrst−Vthsf−Vrdon). Vrdon denotes a voltage drop caused by on-resistance of the read transistor Mrd.

At time t3, the detection control circuit 11 sets the read control signal RD to LOW (low-level voltage). As a result, the read transistor Mrd is turned off (into the nonconduction state) to set the voltage of the node N2 to be constant at (Vrst−Vthsf). The output signal line SL is loaded so as to output the voltage of the detection signal Vdet at LOW (low-level voltage).

At time t4, the detection control circuit 11 sets the read control signal RD to HIGH (high-level voltage). As a result, after the exposure period Pch ends, the read transistor Mrd is turned on (into the conduction state) to start the read period Pdet. The voltage of the node N2 changes to (Vrst−Vthsf−Vphoto) in response to the signal Vphoto. The voltage of a detection signal Vdet2 output in the read period Pdet decreases by an amount of the signal Vphoto from the voltage of the detection signal Vdet1 obtained at time t3 and is set to (Vrst−Vthsf−Vrdon−Vphoto).

The detector 40 can detect the light irradiating the photoelectric conversion element 30 based on a potential difference (Vphoto) between the detection signal Vdet1 detected in the reset period Prst and the detection signal Vdet2 detected in the read period Pdet. While FIG. 6 illustrates the operation example of one of the detection elements 3, the first gate line drive circuit 15A and the second gate line drive circuit 15B can cause the detection elements 3 in the entire detection region AA to perform the detection by sequentially scanning the reset control scan lines GLrst and the read control scan lines GLrd in a time-division manner. In FIG. 6, the example of detecting the light irradiating the photoelectric conversion element 30 based on the potential difference (Vphoto) between the detection signal Vdet1 detected in the reset period Prst and the detection signal Vdet2 detected in the read period Pdet is described. However, the present disclosure is not limited to this and may have an aspect of detecting the light irradiated to the photoelectric conversion element 30 using the voltage of the detection signal Vdet2 detected in the read period Pdet.

Figure 7:
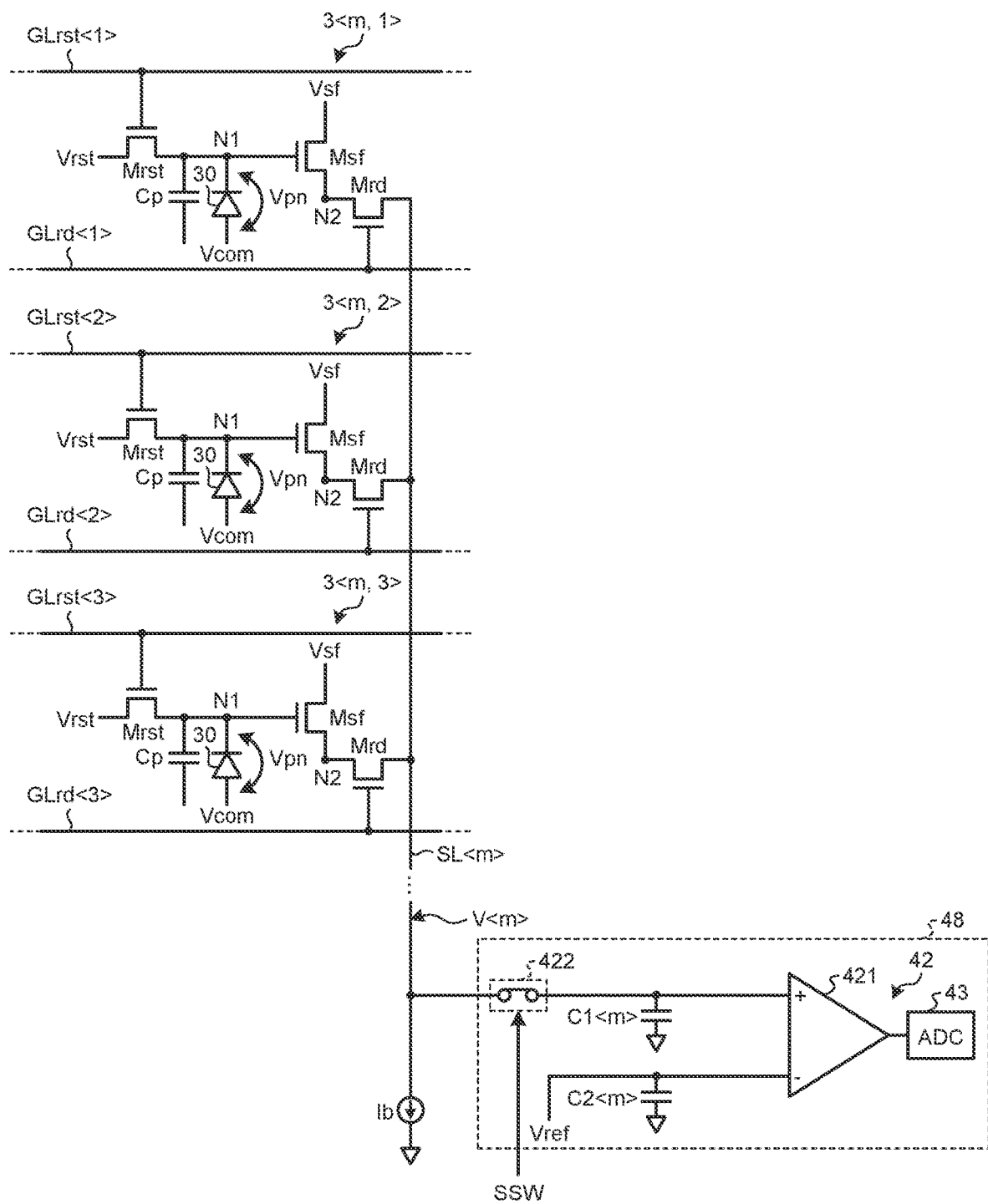
FIG. 7 is a diagram illustrating a coupling example of between a detection element and a detection circuit of a detection device according to a comparative example.

FIG. 7 is a diagram illustrating a coupling example of between a detection element and a detection circuit of a detection device according to a comparative example. In the following description, a parameter corresponding to the m-th column and n-th row (m is a natural number less than or equal to M, n is a natural number less than or equal to N) is also referred to as "X<m,n>". A parameter corresponding to the m-th column is also referred to as "X<m>". A parameter corresponding to the n-th row is also referred to as "X<n>".

FIG. 7 illustrates the coupling example of detection elements 3<m,1>, 3<m,2>, 3<m,3>, . . . , arranged in the m-th column, with the detection circuit 48 via the m-th column output signal line SL<m>.

As mentioned above, the photoelectric conversion element 30 is reverse biased during the reset period Prst (refer to FIG. 6). At this time, a reverse bias voltage Vpn, which is the potential difference between the reset voltage Vrst and the common voltage Vcom, is applied to the photoelectric conversion element 30.

A constant current source is coupled to the detection circuit 48 to apply a bias current Ib to the read transistor Mrd. As a result, the detection voltage V<m> (the voltage of detection signal Vdet1 detected in the reset period Prst and the voltage of detection signal Vdet2 detected in the read period Pdet) of the detection element 3 can be detected. The constant current source may be provided in the detection circuit 48 or in the substrate 21. In FIG. 7, a capacitance Cp can be a parasitic capacitance of the photoelectric conversion element 30 or an individual capacitance outside the photoelectric conversion element 30.

The detection circuit 48 is coupled to the output signal line SL<m>. The detection signal amplifying circuit 42 of the detection circuit 48 outputs a voltage corresponding to the voltage of the output signal line SL<m> to the A/D conversion circuit 43.

Specifically, the detection signal amplifying circuit 42 includes a differential amplifying circuit 421, a first capacitive element C1<m> coupled to the non-inverting input (+) of the differential amplifying circuit 421, and a second capacitive element C2<m> coupled to the inverting input (−) of the differential amplifying circuit 421. In the comparative example, in the differential amplifying circuit 421, the detection voltage V<m> of the detection element 3 is applied to the non-inverting input (+) via the output signal line SL<m>, and an electric charge corresponding to the detection voltage V<m> is charged to the first capacitive element C1<m>. In the differential amplifying circuit 421, a reference voltage Vref is also applied to the inverting input (−), and an electric charge according to the reference voltage Vref is charged to the second capacitive element C2<m>.

Figure 8:
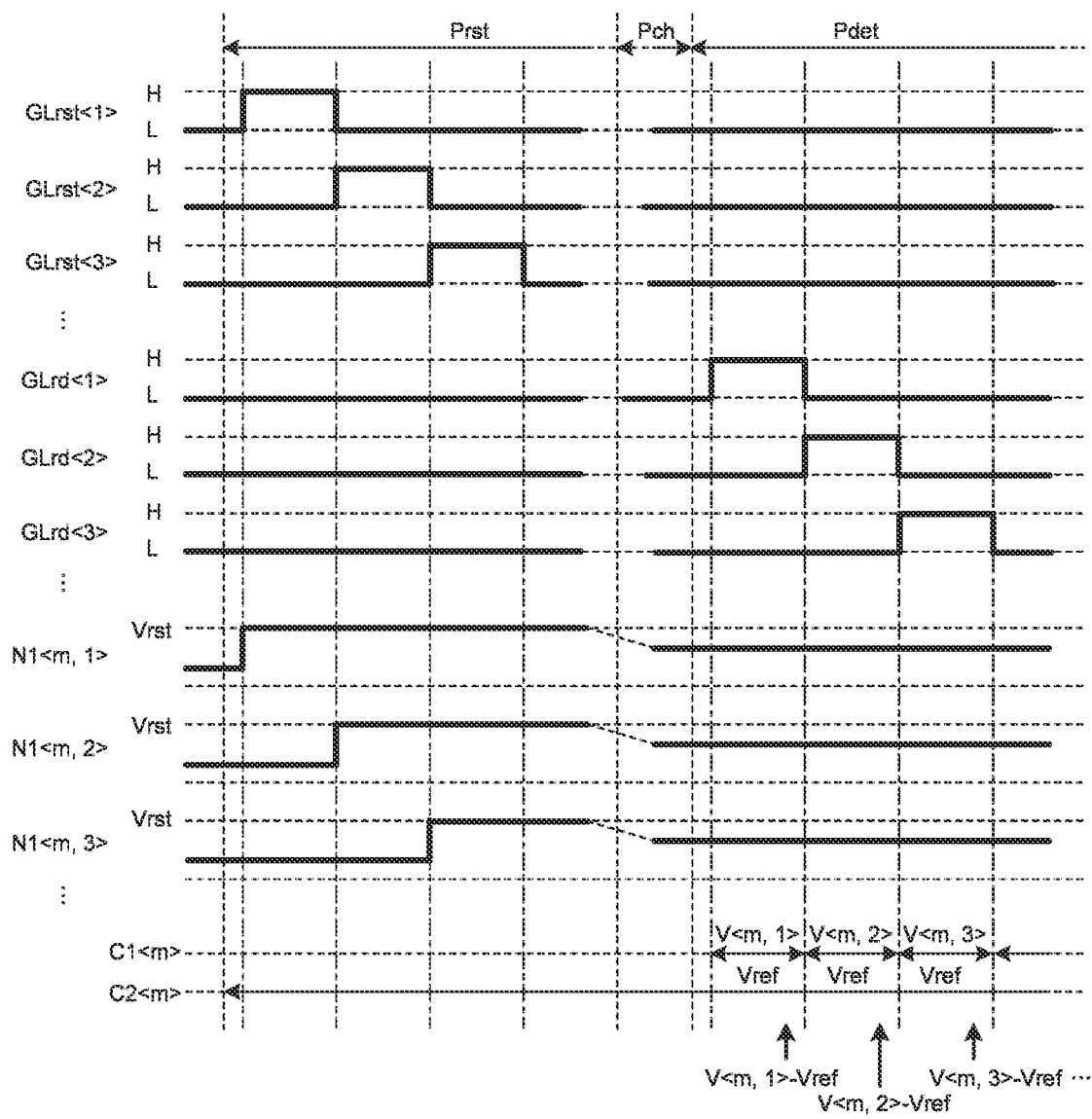
FIG. 8 is a diagram illustrating an example of a timing chart during a detection operation of the detection device according to the comparative example.

FIG. 8 is a diagram illustrating an example of a timing chart during a detection operation of the detection device according to the comparative example.

In the reset period Prst, the first gate line drive circuit 15A sets the reset control scan lines GLrst<1>, GLrst<2>, GLrst<3>, . . . , sequentially "H" (high level voltage) based on the synchronization signal STV and the clock signal CK output from the detection control circuit 11. As a result, the reset transistor Mrst of each detection element 3 is sequentially turned on (into the conduction state) to increase the voltage of the node N1 to the reset voltage Vrst. At this time, the photoelectric conversion element 30 is reverse biased by a voltage difference between the reset voltage Vrst and the common voltage Vcom. The read transistor Mrd is off (into the nonconduction state). Hence, the source of the source follower transistor Msf is charged by the power supply voltage Vsf to increase the voltage of the node N2.

During the exposure period Pch after the reset period Prst, the voltage at node N1 decreases in response to light irradiated on the photoelectric conversion element 30.

In the read period Pdet after the exposure period Pch, the second gate line drive circuit 15B sets the read control scan lines GLrd<1>, GLrd<2>, GLrd<3>, . . . , sequentially to "H" (high level voltage) based on the clock signal CK output from the detection control circuit 11. As a result, the read transistors Mrd of each detection element 3 are sequentially turned on (into the conduction state), and an electric charge corresponding to the detection voltage V<m> of the detection element 3 is charged to the first capacitive element C1<m> via the output signal line SL<m>.

The A/D conversion circuit 43 converts a value of a potential difference between the detection voltage V<m> charged to the first capacitive element C1<m> and the reference voltage Vref charged to the second capacitive element C2<m>, which is amplified by the differential amplifying circuit 421, into a digital signal during the "H" period of the read control scan line GLrd<m>.

Specifically, the A/D conversion circuit 43 converts a potential difference between the detection voltage V<m,1> charged to the first capacitive element C1<m> and the reference voltage Vref charged to the second capacitive element C2<m> to digital signals during the "H" period of the read control scan line GLrd<1>.

The A/D conversion circuit 43 converts a potential difference between the detection voltage V<m,2> charged to the first capacitive element C1<m> and the reference voltage Vref charged to the second capacitive element C2<m> to digital signals during the "H" period of the read control scan line GLrd<2>.

The A/D conversion circuit 43 converts a potential difference between the detection voltage V<m,3> charged to the first capacitive element C1<m> and the reference voltage Vref charged to the second capacitive element C2<m> to digital signals during the "H" period of the read control scan line GLrd<3>.

Hereafter, in the same manner, the A/D conversion circuit 43 converts a potential difference between the detection voltage V<m,n> charged to the first capacitive element C1<m> and the reference voltage Vref charged to the second capacitive element C2<m> into a digital signal every "H" period of the read control scan line GLrd<n>.

Thus, by setting sampling timing for obtaining digital data corresponding to each detection element 3<m,n> at each "H" period of the read control scan line GLrd<n>, digital data corresponding to the detection voltage at detection elements 3<m,n> in the entire detection region AA can be obtained.

FIG. 9 is a diagram illustrating an example of digital data acquired during the detection operation of the detection device according to the comparative example. In FIG. 9, for example, the digital data corresponding to the detection voltage at the detection element 3<m,n> is indicated by "V<m,n>−Vref". FIG. 9 illustrates an example of digital data when an amplification (Gain) of the differential amplifying circuit 421 is "1".

When the Gain (amplification) of the differential amplifying circuit 421 is "k", the digital data corresponding to the detection element 3<m,n> is indicated by "k×(V<m,n>−Vref)". Here, for example, when detecting the fingerprints of the finger Fg or information on the living body, it is necessary to detect the difference between each detection element 3<m,n> with high accuracy. However, in an aspect of the comparative example, the digital data corresponding to the detection voltage for each detection element 3<m,n> is obtained, thus the data value of each digital data becomes large. If the Gain (amplification) of the differential amplifying circuit 421 is increased in order to detect the difference of detection voltages between each detection element 3<m, n> with high accuracy, a data overflow may occur in the subsequent digital signal processing circuit (for example, the signal processing circuit 44 or the coordinate extraction circuit 45), and a detection accuracy of the fingerprint may be reduced.

In the present disclosure, by obtaining the digital data corresponding to the potential difference of detection voltage between adjacent detection elements 3, the data value of each digital data is smaller than the comparative example in which the digital data corresponding to the detection voltage for each detection element 3<m,n> is obtained. As a result, the data overflow in subsequent digital signal processing circuits (for example, the signal processing circuit 44 and the coordinate extraction circuit 45) can be suppressed, and thereby improving the accuracy of fingerprint detection. The following describes a configuration and operation for obtaining the digital data corresponding to the potential difference of detection voltage between adjacent detection elements 3.

First Embodiment

Figure 10:
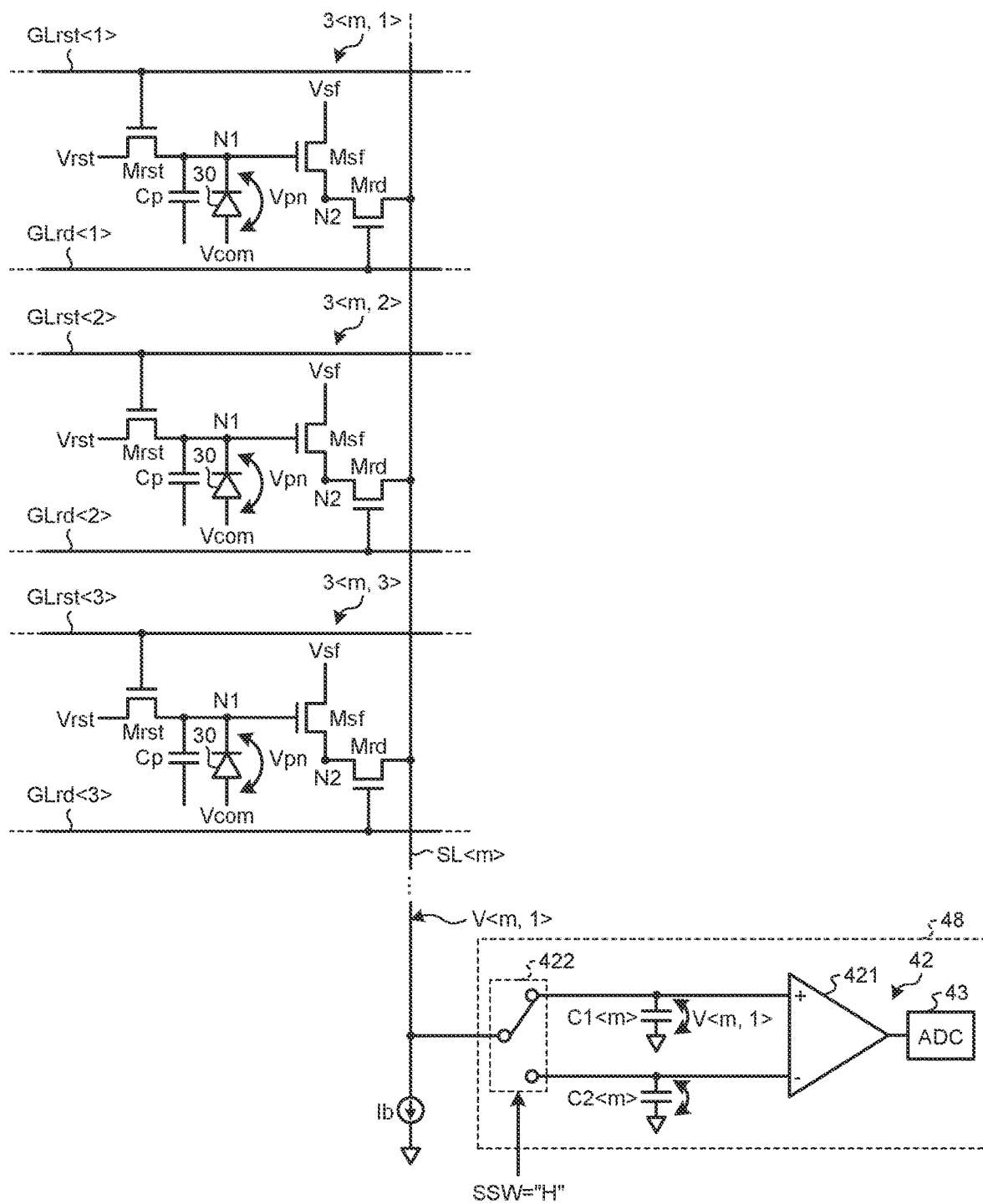
FIG. 10 is a diagram illustrating a coupling example of between a detection element and a detection circuit of a detection device according to a first embodiment.
Figure 11:
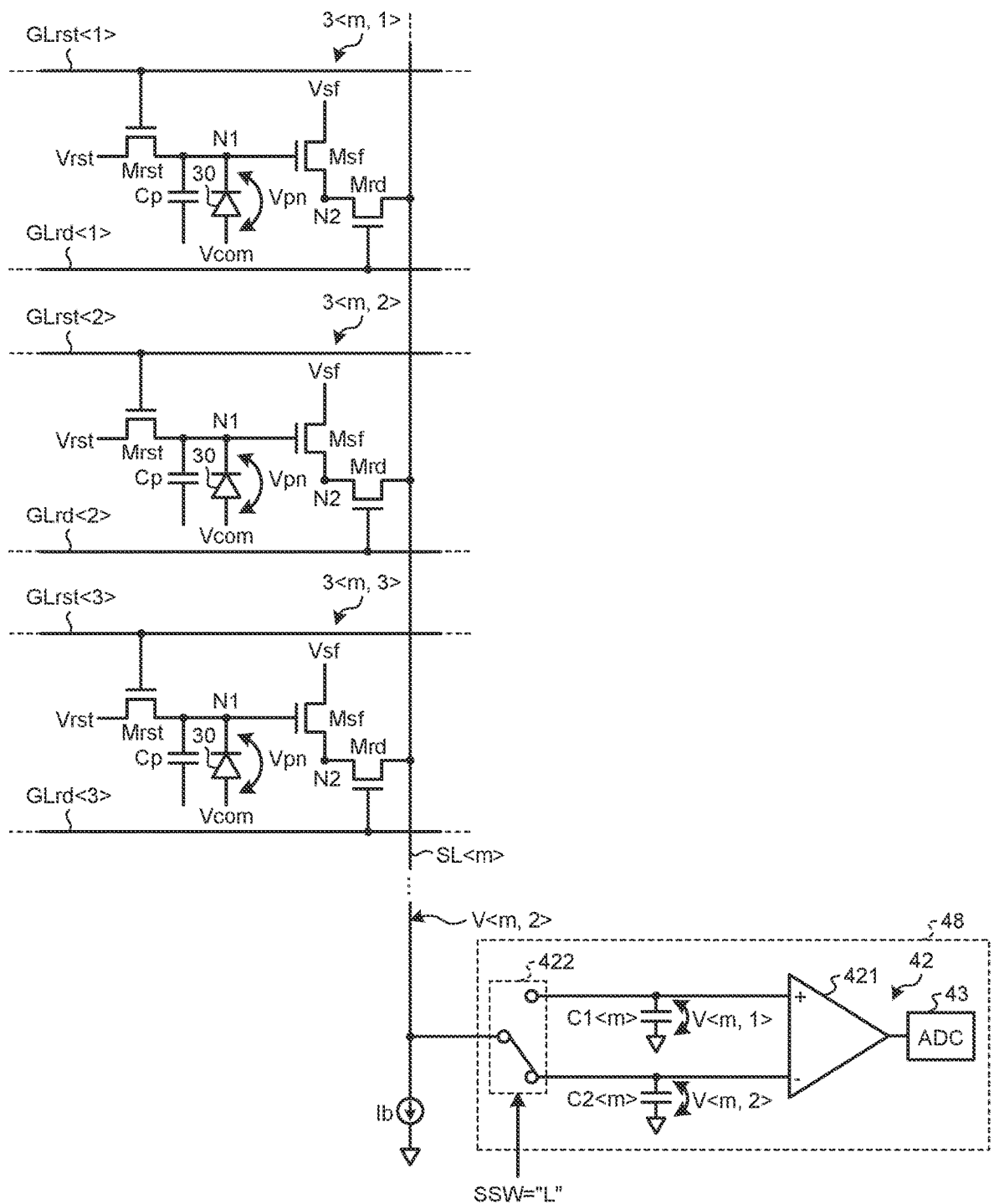
FIG. 11 is a diagram illustrating the coupling example of between the detection element and the detection circuit of the detection device according to the first embodiment.
Figure 12:
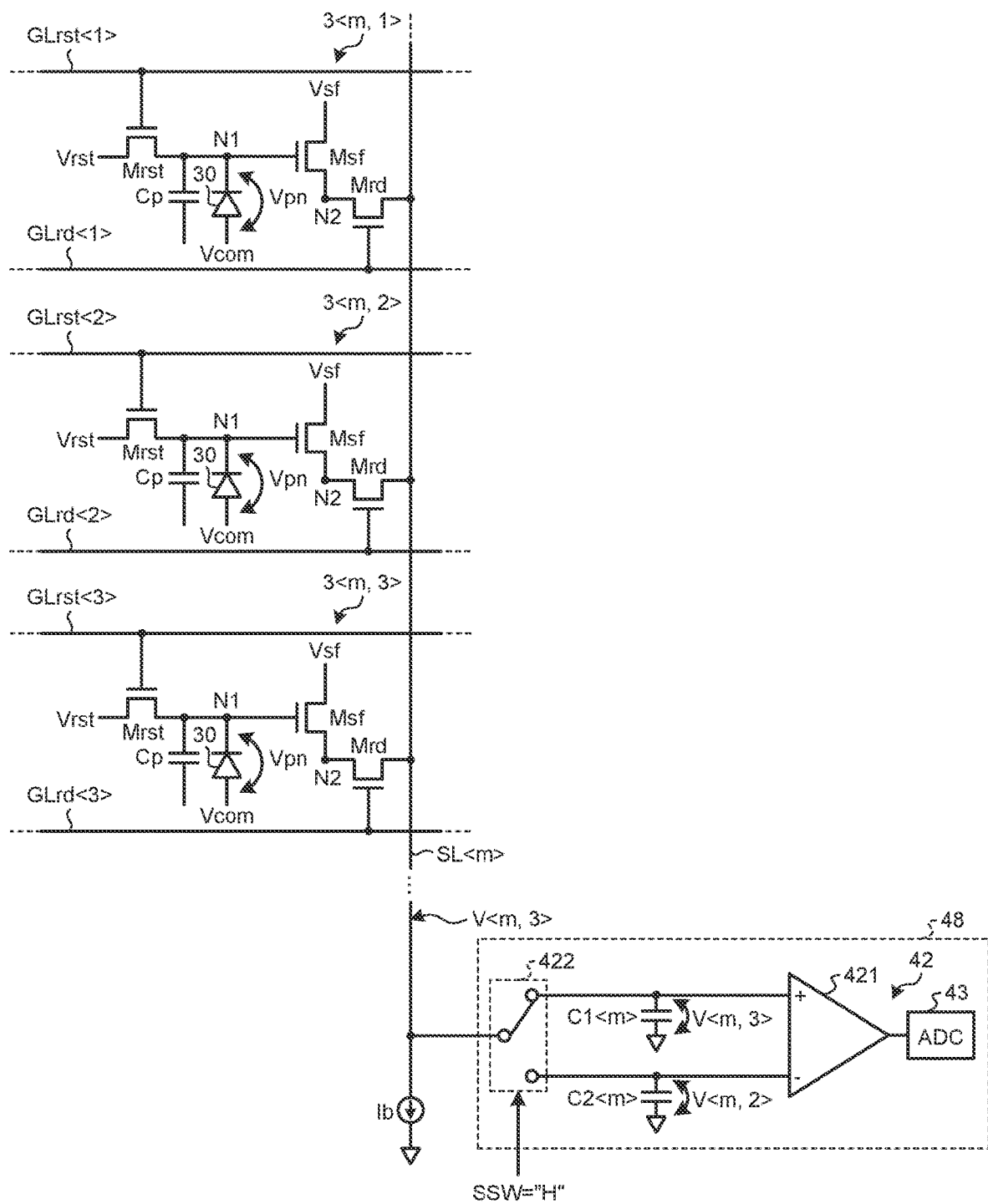
FIG. 12 is a diagram illustrating the coupling example of between the detection element and the detection circuit of the detection device according to the first embodiment.
Figure 13:
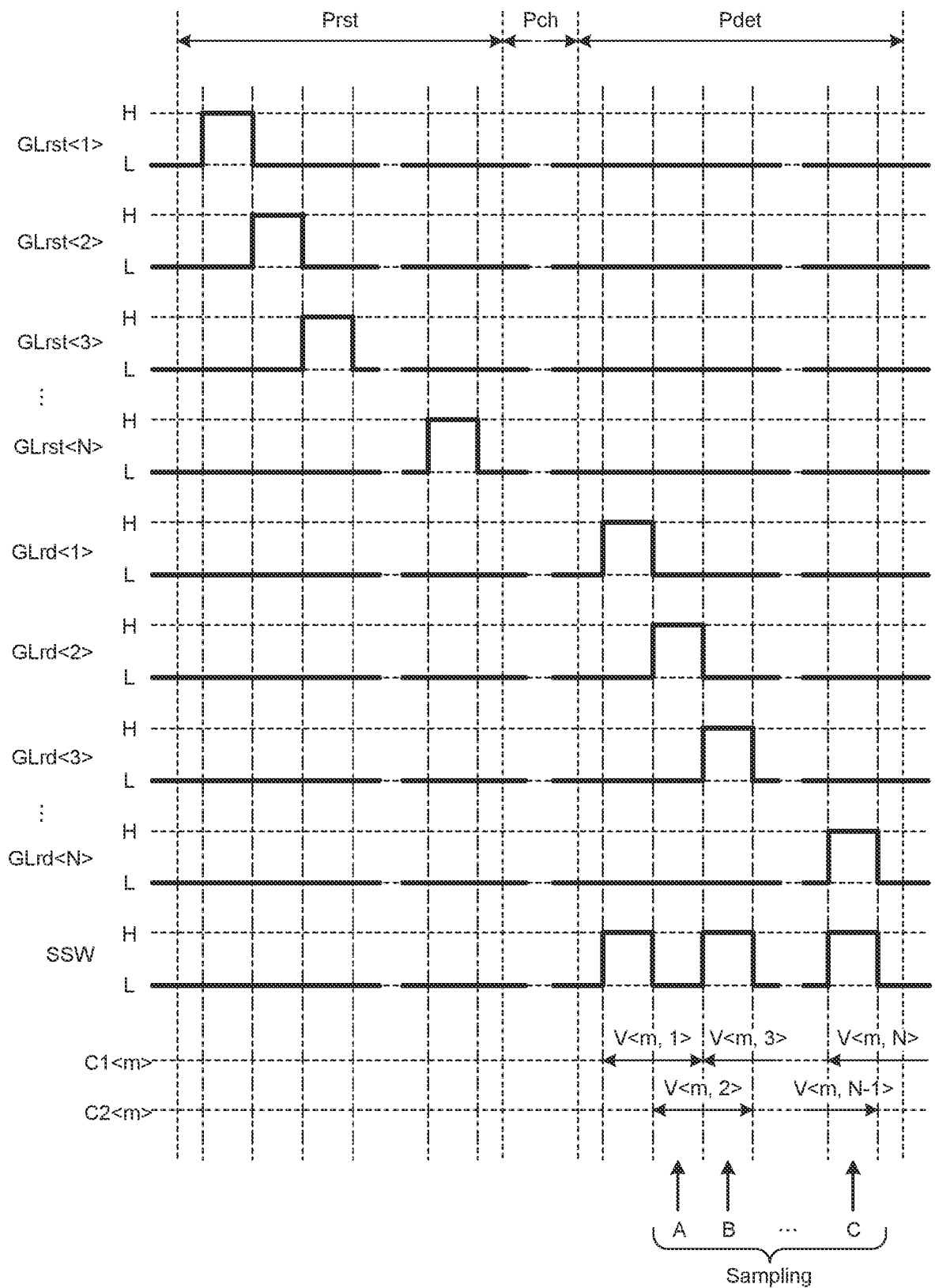
FIG. 13 is a diagram illustrating an example of a timing chart during a detection operation of the detection device according to the first embodiment.

FIGS. 10, 11, and 12 are diagrams illustrating the coupling example of between the detection element and the detection circuit of the detection device according to the first embodiment. FIG. 13 is a diagram illustrating an example of a timing chart during a detection operation of the detection device according to the first embodiment. FIG. 10 illustrates the coupling example in the "H" period of the read control scan line GLrd<1> illustrated in FIG. 13. FIG. 11 illustrates the coupling example in the "H" period of the read control scan line GLrd<2> illustrated in FIG. 13. FIG. 12 illustrates the coupling example in the "H" period of the read control scan line GLrd<3> illustrated in FIG. 13. The components that have the same functions as those in the comparative example described above are denoted by the same reference numerals and description thereof is not be repeated.

The detection signal amplifying circuit 42 according to the first embodiment includes the differential amplifying circuit 421, the first capacitive element C1<m> coupled to the non-inverting input (+) of the differential amplifying circuit 421, the second capacitive element C2<m> coupled to the inverting input (−) of the differential amplifying circuit 421, and a switch circuit 422 that applies the detection voltage V<m> input through the output signal line SL<m> to one of the non-inverting input (+) and the inverting input (−) of the differential amplifying circuit 421.

In the first embodiment, in the differential amplifying circuit 421, a detection voltage V<m,odd> of a detection element 3<m,odd> in odd rows is applied to the non-inverting input (+) via the switch circuit 422, and the electric charge corresponding to a detection voltage V<m,odd> is charged to the first capacitive element C1<m>. In the differential amplifying circuit 421, a detection voltage V<m, even> of a detection element 3<m,even> of even rows is applied to the inverting input (−) via the switch circuit 422, and an electric charge corresponding to the detection voltage V<m,even> is charged to the second capacitive element C2<m>.

The detection control circuit 11 switches the control state of the switch circuit 422 in synchronization with the read control scan line GLrd<m>. As a result, the output signal line SL<m> is electrically coupled to one of the non-inverting input (+) and inverting input (−) of the differential amplifying circuit 421.

Specifically, the detection control circuit 11, for example, sets the differential input switching signal SSW to "H" (high level voltage) during the "H" (high level voltage) period of the read control scan line GLrd<odd> in odd rows, and controls the non-inverting input (+) of the differential amplifying circuit 421 so that the detection voltage V<m,odd> of the detection element 3<m,odd> in the odd rows is applied.

The detection control circuit 11, for example, also sets the differential input switching signal SSW to "L" (low level voltage) during the "H" (high level voltage) period of the read control scan line GLrd<even> in even rows, and controls the inverting input (−) of the differential amplifying circuit 421 so that the detection voltage V<m,even> of the detection element 3<m,even> in the even rows is applied.

The A/D conversion circuit 43 converts a value of a potential difference between the detection voltage V<m, odd> charged to the first capacitive element C1<m> and the detection voltage V<m,even> charged to the second capacitive element C2<m>, which is amplified by the differential amplifying circuit 421, into a digital signal during the "H" period of the read control scan line GLrd<m>.

Specifically, the differential input switching signal SSW is controlled to "H" during the "H" period of the read control scan line GLrd<1>. As a result, an electric charge corresponding to the detection voltage V<m,1> of the detection element 3<m,1> is charged to the first capacitive element C1<m>.

In the subsequent "H" period of the read control scan line GLrd<2>, the differential input switching signal SSW is controlled to "L". As a result, an electric charge corresponding to the detection voltage V<m,2> of the detection element 3<m,2> is charged to the second capacitive element C2<m>. At this time, the electric charge charged to the first capacitive element C1<m> is maintained.

During the "H" period of this read control scan line GLrd<2>, more specifically, at a sampling timing A illustrated in FIG. 13, the A/D conversion circuit 43 converts a potential difference between the detection voltage V<m,1> charged to the first capacitive element C1<m> and the detection voltage V<m,2> charged to the second capacitive element C2<m> into a digital signal.

In the subsequent "H" period of the read control scan line GLrd<3>, the differential input switching signal SSW is controlled to "H". As a result, an electric charge corresponding to the detection voltage V<m,3> of the detection element 3<m,3> is charged to the first capacitive element C1<m>. At this time, the electric charge charged to the second capacitive element C2<m> is maintained.

During the "H" period of this read control scan line GLrd<3>, more specifically, at a sampling timing B illustrated in FIG. 13, the A/D conversion circuit 43 converts a potential difference between the detection voltage V<m,3> charged to the first capacitive element C1<m> and the detection voltage V<m,2> charged to the second capacitive element C2<m> into a digital signal.

The digital data obtained at the sampling timing B preferably has an aspect of performing sign inversion processing on digitally converted data in the subsequent digital signal processing circuit (for example, the signal processing circuit 44).

Hereafter, in the same manner, the A/D conversion circuit 43 converts the potential difference between the detection voltage V<m,odd> charged to the first capacitive element C1<m> and the detection voltage V<m,even> charged to the second capacitive element C2<m> to digital signals every "H" period of the read control scan line GLrd<n>. The A/D conversion circuit 43 also converts a potential difference between the detection voltage V<m,N> charged to the first capacitive element C1<m> and the detection voltage V<m, N−1> charged to the second capacitive element C2<m> into a digital signal at a sampling timing C illustrated in FIG. 13.

By performing the operation described above for all output signal lines SL<m>, the digital data corresponding to the potential difference of the detection voltage between two adjacent detection elements 3 in the second direction Dy can be obtained.

FIG. 14 is a diagram illustrating a correspondence relationship of digital data acquired at each sampling timing of the timing chart illustrated in FIG. 13. FIG. 15 is a diagram illustrating an example of digital data acquired during the detection operation of the detection device according to the first embodiment. FIG. 15 illustrates an example of digital data when the Gain (amplification) of the differential amplifying circuit 421 is "1". In FIG. 15, for example, digital data corresponding to a potential difference between the detection element 3<m,n> and a detection element 3<m,n+1> is indicated by "V<m,n>−V<m,n+1>".

When the Gain (amplification) of the differential amplifying circuit 421 is "k", digital data corresponding to the potential difference between the detection elements 3<m,n> and the 3<m,n+1> is indicated by "k×(V<m,n>−V<m,n+1>)". The digital data obtained by the configurations and operations of the first embodiment illustrated in FIGS. 10, 11, 12, and 13 described above is the digital data corresponding to the potential difference of the detection voltage between two adjacent detection elements 3 in the second direction Dy. Thus, the values are relatively smaller than the digital data obtained by the configurations and operation of the comparative example illustrated in FIGS. 7 and 8. Therefore, the Gain (amplification) of the differential amplifying circuit 421 can be larger than the comparative example without causing the data overflow in the subsequent digital signal processing circuits (for example, the signal processing circuit 44 and the coordinate extraction circuit 45). As a result, more accurate fingerprint detection than in the comparative example can be achieved. In the configurations of the first embodiment illustrated in FIGS. 10, 11, 12, and 13, the number of data in the column direction (second direction Dy, vertical direction illustrated in FIG. 15) is N−1.

Figure 16:
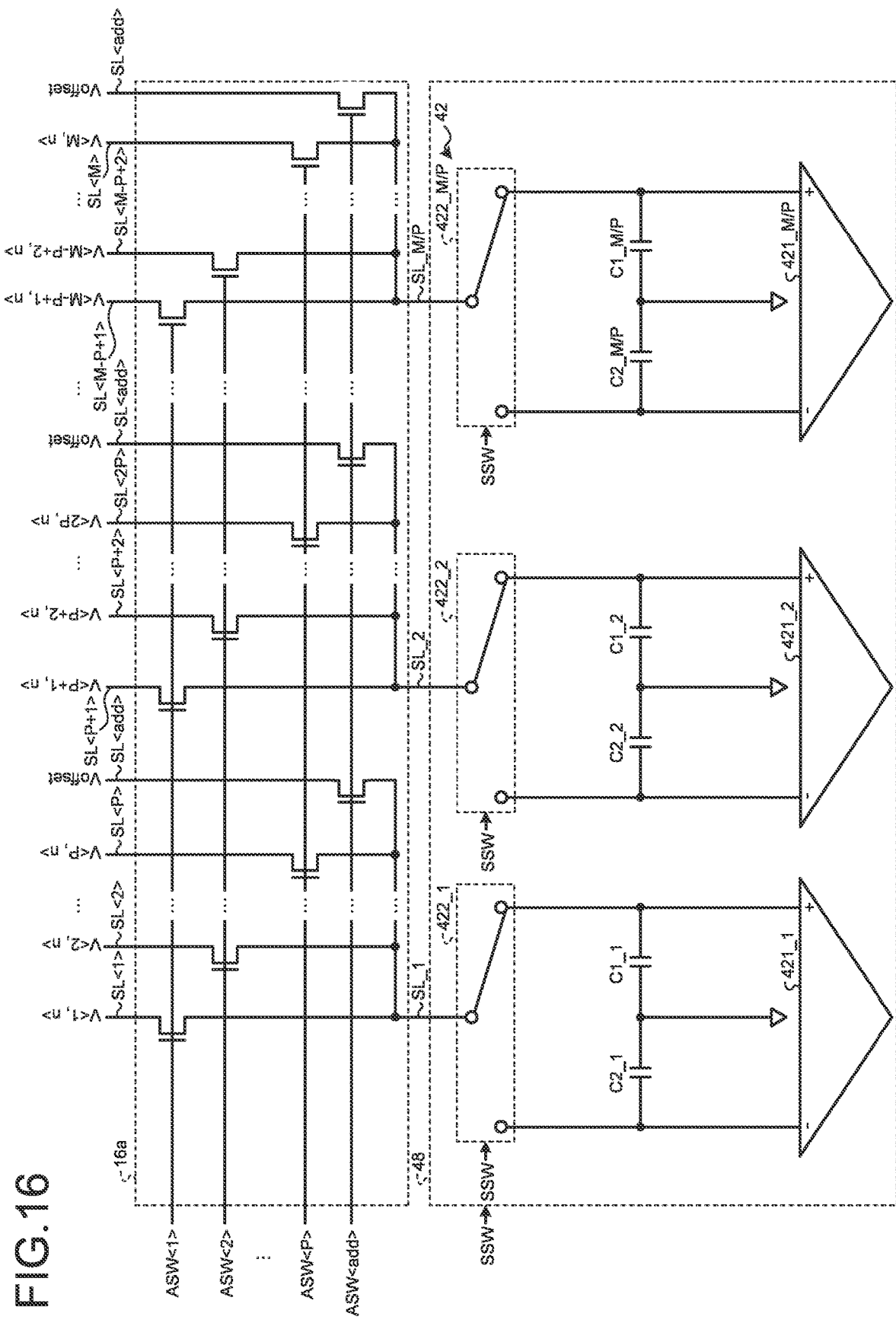
FIG. 16 is a diagram illustrating one configuration example of a signal line selection circuit and the detection circuit according to the first embodiment.
Figure 17:
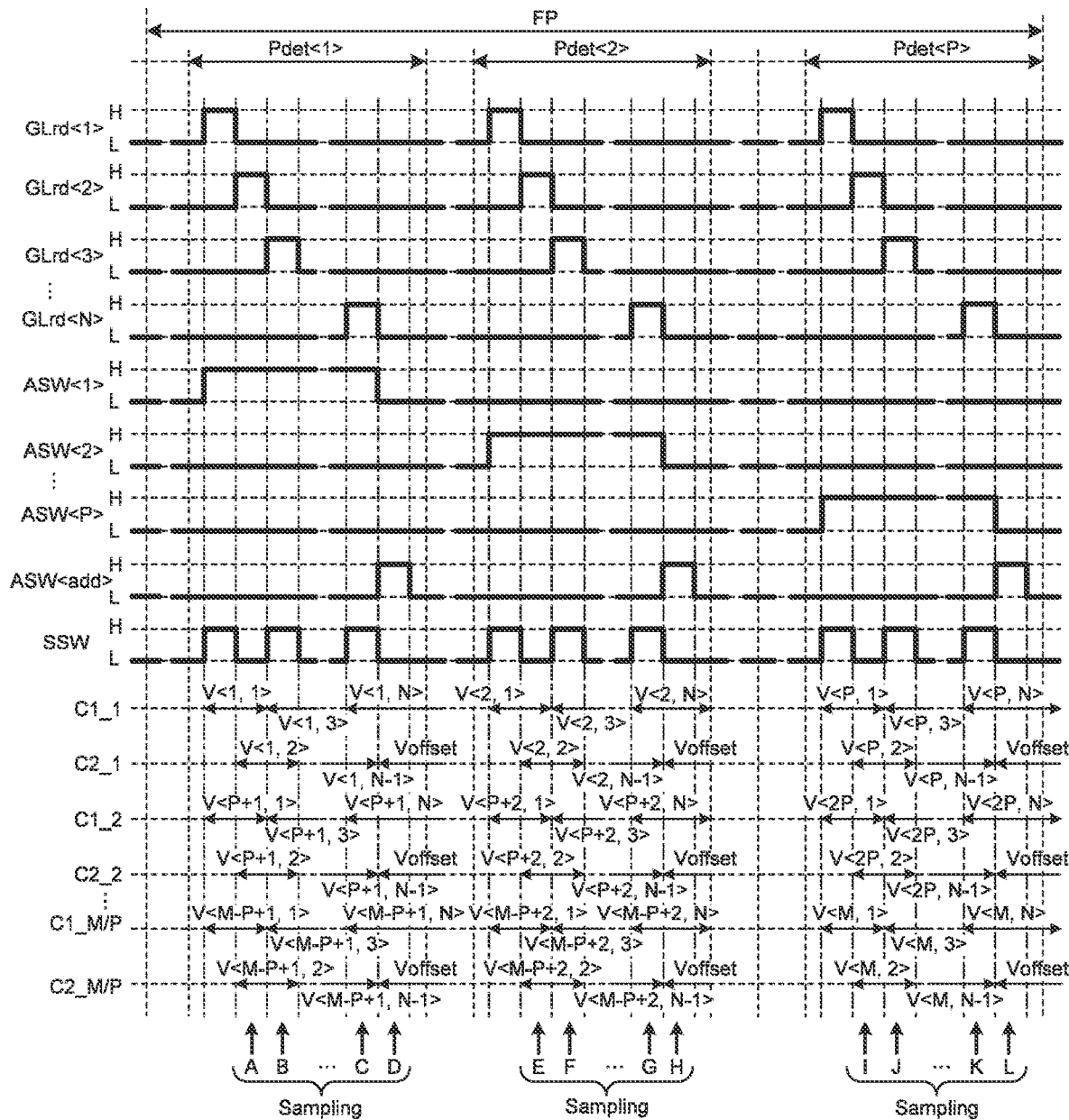
FIG. 17 is a diagram illustrating an example of a timing chart during a detection operation of the signal line selection circuit and the detection circuit according to the first embodiment.

The following describes a more specific configuration example and operation of the detection device 1 according to the first embodiment. FIG. 16 is a diagram illustrating one configuration example of a signal line selection circuit and the detection circuit according to the first embodiment. FIG. 17 is a diagram illustrating an example of a timing chart during a detection operation of the signal line selection circuit and the detection circuit according to the first embodiment. In FIG. 17, the reset period Prst and the exposure period Pch are omitted.

In the examples illustrated in FIGS. 16 and 17, the signal line selection circuit 16 simultaneously selects output signal lines SL<p>, SL<P+p>, . . . , SL<M−P+p> (p is a natural number less than or equal to P) based on signal line selection signals ASW<1>, ASW<2>, . . . , ASW<P> (P is a natural number equal to or less than M/2) supplied from the detection control circuit 11, and the selected output signal line SL is electrically coupled to the detection circuit 48. In the examples illustrated in FIGS. 16 and 17, one differential amplifying circuit 421_1, 421_2, 421_M/P is provided for each of the output signal lines SL<p>, SL<P+p>, . . . , SL<M−P+p> that are simultaneously selected by the signal line selection circuit 16.

In the present embodiment, the signal line selection circuit 16 selects an offset voltage supply signal line SL<add> for supplying a predetermined offset voltage Voffset to the differential amplifying circuits 421_1, 421_2, . . . , 421_M/P based on a signal line selection signal ASW<add> supplied from the detection control circuit 11, and the offset voltage supply signal line SL<add> is electrically coupled to the detection circuit 48. The offset voltage supply signal line SL<add> does not necessarily need to be provided in the detection region AA, as long as, in an aspect of the present disclosure, the predetermined offset voltage Voffset can be supplied to the differential amplifying circuits 421_1, 421_2, . . . , 421_M/P.

Switch circuits 422_1, 422_2, . . . , 422_M/P of the detection circuit 48 applies the detection voltage V<m,n> or the predetermined offset voltage Voffset input via the signal line selection circuit 16 to either the non-inverting input (+) or the inverting input (−) of the differential amplifying circuits 421_1, 421_2, . . . , 421_M/P based on the differential input switching signal SSW supplied from the detection control circuit 11 via the detection timing control circuit 47.

The detection control circuit 11 sets a signal line selection signal ASW<p> to "H" (high level voltage) during a read period Pdet<p>. The second gate line drive circuit 15B, in the "H" period of each signal line selection signal ASW<p>, sequentially selects the read control scan lines GLrd<1>, GLrd<2>, GLrd<3>, . . . , GLrd<N> and supplies a read control signal RD to the selected read control scan line GLrd. As a result, the detection voltage V<m,n> of the detection element 3<m,n> is supplied to the detection circuit 48. In the present disclosure, the detection control circuit 11 sets the signal line selection signal ASW<p> to "L" (low level voltage) in the read period Pdet<p>, and then sets the signal line selection signal ASW<add> to "H" (high level voltage). As a result, the predetermined offset voltage Voffset is supplied to the detection circuit 48.

During the read period Pdet<1>, the detection circuit 48 obtains digital data corresponding to a potential difference between a detection voltage of a detection element 3<1,n> coupled to an output signal line SL<1> and a detection voltage of a detection element 3<1,n+1>.

Specifically, the differential input switching signal SSW is controlled to "H" in the "H" period of the read control scan line GLrd<1> during the read period Pdet<1>. As a result, an electric charge according to a detection voltage V<1,1> of a detection element 3<1,1> is charged to a first capacitive element C1_1, an electric charge according to a detection voltage V<P+1,1> of a detection element 3<P+1,1> is charged to a first capacitive element C1_2, and an electric charge corresponding to a detection voltage V<M−P+1,1> of a detection element 3<M−P+1,1> is charged to a first capacitive element C1_M/P.

In the subsequent "H" period of the read control scan line GLrd<2>, the differential input switching signal SSW is controlled to "L". As a result, an electric charge according to a detection voltage V<1,2> of a detection element 3<1,2> is charged to a second capacitive element C2_1, an electric charge according to a detection voltage V<P+1,2> of a detection element 3<P+1,2> is charged to a second capacitive element C2_2, and an electric charge corresponding to a detection voltage V<M−P+1,2> of a detection element 3<M−P+1,2> is charged to the second capacitive element C2_M/P. At this time, the electric charge charged to the first capacitive elements C1_1, C1_2, . . . , C1_M/P is maintained.

In the "H" period of the read control scan line GLrd<2> in this read period Pdet<1>, more specifically, at the sampling timing A illustrated in FIG. 17, the A/D conversion circuit 43 converts a potential difference between the detection voltage V<1,1> charged to the first capacitive element C1_1 and the detection voltage V<1,2> charged to the second capacitive element C2_1 into a digital signal, a potential difference between the detection voltage V<P+1, 1> of the detection element 3<P+1,1> charged to the first capacitive element C1_2 and the detection voltage V<P+1, 2> of the detection element 3<P+1,2> charged to the second capacitive element C2_2 into a digital signal, and a potential difference between the detection voltage V<M−P+1,1> of the detection element 3<M−P+1,1> charged to the first capacitive element C1_M/P and the detection voltage V<M−P+1,2> of the detection element 3<M−P+1,2> charged to the second capacitive element C2_M/P into a digital signal.

In the subsequent "H" period of the read control scan line GLrd<3>, the differential input switching signal SSW is also controlled to "H". As a result, an electric charge according to a detection voltage V<1,3> of a detection element 3<1,3> is charged to a first capacitive element C1_1, an electric charge according to a detection voltage V<P+1,3> of a detection element 3<P+1,3> is charged to a first capacitive element C1_2, an electric charge corresponding to a detection voltage V<M−P+1,3> of a detection element 3<M−P+1,3> is charged to a first capacitive element C1_M/P. At this time, the electric charge charged to the second capacitive elements C2_1, C2_2, . . . , C2_M/P is maintained.

In the "H" period of the read control scan line GLrd<3> during this read period Pdet<1>, more specifically, at the sampling timing B illustrated in FIG. 17, the A/D conversion circuit 43 converts a potential difference between the detection voltage V<1,3> charged to the first capacitive element C1_1 and the detection voltage V<1,2> charged to the second capacitive element C2_1 into a digital signal, a potential difference between the detection voltage V<P+1, 3> of the detection element 3<P+1,3> charged to the first capacitive element C1_2 and the detection voltage V<P+1, 2> of the detection element 3<P+1,2> charged to the second capacitive element C2_2 into a digital signal, and a potential difference between the detection voltage V<M−P+1,3> of the detection element 3<M−P+1,3> charged to the first capacitive element C1_M/P and the detection voltage V<M−P+1,2> of the detection element 3<M−P+1,2> charged to the second capacitive element C2_M/P into a digital signal. The subsequent digital signal processing circuit (for example, signal processing circuit 44) performs the sign inversion processing on the digitally converted data.

The differential input switching signal SSW is controlled to "H" in the "H" period of the read control scan line GLrd<N> during the read period Pdet<1>. As a result, an electric charge according to a detection voltage V<1,N> of a detection element 3<1,N> is charged to a first capacitive element C1_1, an electric charge according to a detection voltage V<P+1,N> of a detection element 3<P+1,N> is charged to a first capacitive element C1_2, and an electric charge corresponding to a detection voltage V<M−P+1,N> of a detection element 3<M−P+1,N> is charged to a first capacitive element C1_M/P. At this time, the electric charge charged to the second capacitive elements C2_1, C2_2, . . . , C2_M/P is maintained.

In the "H" period of the read control scan line GLrd<N> during the read period Pdet<1>, more specifically, at the sampling timing C illustrated in FIG. 17, the A/D conversion circuit 43 converts a potential difference between the detection voltage V<1,N> charged to the first capacitive element C1_1 and the detection voltage V<1,N−1> charged to the second capacitive element C2_1 into a digital signal, a potential difference between the detection voltage V<P+1, N> of the detection element 3<P+1,N> charged to the first capacitive element C1_2 and the detection voltage V<P+1, N−1> of the detection element 3<P+1,N−1> charged to the second capacitive element C2_2 into a digital signal, and a potential difference between the detection voltage V<M−P+1,N> of the detection element 3<M−P+1,N> charged to the first capacitive element C1_M/P and the detection voltage V<M−P+1,N−1> of the detection element 3<M−P+1,N−1> charged to the second capacitive element C2_M/P into a digital signal. The subsequent digital signal processing circuit (for example, signal processing circuit 44) performs the sign inversion processing on the digitally converted data.

Then, after the "H" period of the read control scan line GLrd<N> in the read period Pdet<1>, the differential input switching signal SSW is controlled to "L". As a result, an electric charge corresponding to the predetermined offset voltage Voffset is charged to the second capacitive elements C2_1, C2_2, . . . , C2_M/P. At this time, the electric charge charged to the first capacitive elements C1_1, C1_2, . . . , C1_M/P is maintained.

In a "L" period of the differential input switching signal SSW after the "H" period of the read control scan line GLrd<N> during the read period Pdet<1>, more specifically, at a sampling timing D illustrated in FIG. 17, the A/D conversion circuit 43 converts a potential difference between the detection voltage V<1,N> charged to the first capacitive element C1_1 and the predetermined offset voltage Voffset charged to the second capacitive element C2_1 into a digital signal, a potential difference between the detection voltage V<P+1,N> of the detection element 3<P+1,N> charged to the first capacitive element C1_2 and the predetermined offset voltage Voffset charged to the second capacitive element C2_2 into a digital signal, and a potential difference between the detection voltage V<M−P+1,N> of the detection element 3<M−P+1,N> charged to the first capacitive element C1_M/P and the predetermined offset voltage Voffset charged to the second capacitive element C2_M/P into a digital signal.

In a read period Pdet<2>, the detection circuit 48 also obtains digital data corresponding to a potential difference between the detection voltage of a detection element 3<2,n> coupled to an output signal line SL<2> and the detection voltage of a detection element 3<2,n+1>.

Specifically, the differential input switching signal SSW is controlled to "H" in the "H" period of the read control scan line GLrd<1> during the read period Pdet<2>. As a result, an electric charge according to a detection voltage V<2,1> of a detection element 3<P+2,1> is charged to the first capacitive element C1_1, an electric charge according to a detection voltage V<P+2,1> of a detection element 3<P+2, 1> is charged to the first capacitive element C1_2, an electric charge according to the detection voltage V<M−P+2,1> of a detection element 3<M−P+2,1> is charged to the first capacitive element C1_M/P.

In the subsequent "H" period of the read control scan line GLrd<2>, the differential input switching signal SSW is controlled to "L". As a result, an electric charge according to a detection voltage V<2,2> of a detection element 3<2,2> is charged to a second capacitive element C2_1, an electric charge according to a detection voltage V<P+2,2> of a detection element 3<P+2,2> is charged to a second capacitive element C2_2, and an electric charge corresponding to a detection voltage V<M−P+2,2> of a detection element 3<M−P+2,2> is charged to the second capacitive element C2_M/P. At this time, the electric charge charged to the first capacitive elements C1_1, C1_2, . . . , C1_M/P is maintained.

In the "H" period of the read control scan line GLrd<2> during the read period Pdet<2>, more specifically, at a sampling timing E illustrated in FIG. 17, the A/D conversion circuit 43 converts a potential difference between the detection voltage V<2,1> charged to the first capacitive element C1_1 and the detection voltage V<2,2> charged to the second capacitive element C2_1 into a digital signal, a potential difference between the detection voltage V<P+2, 1> of the detection element 3<P+2,1> charged to the first capacitive element C1_2 and the detection voltage V<P+2, 2> of the detection element 3<P+2,2> charged to the second capacitive element C2_2 into a digital signal, and a potential difference between the detection voltage V<M−P+2,1> of the detection element 3<M−P+2,1> charged to the first capacitive element C1_M/P and the detection voltage V<M−P+2,2> of the detection element 3<M−P+2,2> charged to the second capacitive element C2_M/P into a digital signal.

In the subsequent "H" period of the read control scan line GLrd<3>, the differential input switching signal SSW is also controlled to "H". As a result, an electric charge according to the detection voltage V<2,3> of a detection element 3<2,3> is charged to the first capacitive element C1_1, an electric charge according to a detection voltage V<P+2,3> of a detection element 3<P+2,3> is charged to the first capacitive element C1_2, an electric charge according to a detection voltage V<M−P+2,3> of a detection element 3<M−P+2,3> is charged to the first capacitive element C1_M/P. At this time, the electric charge charged to the second capacitive elements C2_1, C2_2, . . . , C2_M/P is maintained.

In the "H" period of the read control scan line GLrd<3> during the read period Pdet<2>, more specifically, at a sampling timing F illustrated in FIG. 17, the A/D conversion circuit 43 converts a potential difference between the detection voltage V<2,3> charged to the first capacitive element C1_1 and the detection voltage V<2,2> charged to the second capacitive element C2_1 into a digital signal, a potential difference between the detection voltage V<P+2, 3> of the detection element 3<P+2,3> charged to the first capacitive element C1_2 and the detection voltage V<P+2, 2> of the detection element 3<P+2,2> charged to the second capacitive element C2_2 into a digital signal, and a potential difference between the detection voltage V<M−P+2,3> of the detection element 3<M−P+2,3> charged to the first capacitive element C1_M/P and the detection voltage V<M−P+2,2> of the detection element 3<M−P+2,2> charged to the second capacitive element C2_M/P into a digital signal. The subsequent digital signal processing circuit (for example, signal processing circuit 44) performs the sign inversion processing on the digitally converted data.

The differential input switching signal SSW is controlled to "H" in the "H" period of the read control scan line GLrd<N> during the read period Pdet<2>. As a result, an electric charge according to a detection voltage V<2,N> of the detection element 3<2,N> is charged to the first capacitive element C1_1, an electric charge according to a detection voltage V<P+2,N> of a detection element 3<P+2,N> is charged to the first capacitive element C1_2, and an electric charge according to a detection voltage V<M−P+2,N> of a detection element 3<M−P+2,N> is charged to the first capacitive element C1_M/P. At this time, the electric charge charged to the second capacitive elements C2_1, C2_2, . . . , C2_M/P is maintained.

In the "H" period of the read control scan line GLrd<N> during the read period Pdet<2>, more specifically, at a sampling timing G illustrated in FIG. 17, the A/D conversion circuit 43 converts a potential difference between the detection voltage V<2,N> charged to the first capacitive element C1_1 and a detection voltage V<2,N−1> charged to the second capacitive element C2_1 into a digital signal, a potential difference between the detection voltage V<P+2, N> of the detection element 3<P+2,N> charged to the first capacitive element C1_2 and a detection voltage V<P+2,N− 1> of a detection element 3<P+2,N−1> charged to the second capacitive element C2_2 into a digital signal, and a potential difference between the detection voltage V<M−P+ 2,N> of the detection element 3<M−P+2,N> charged to the first capacitive element C1_M/P and a detection voltage V<M−P+2,N−1> of a detection element 3<M−P+2,N−1> charged to the second capacitive element C2_M/P into a digital signal. The subsequent digital signal processing circuit (for example, signal processing circuit 44) performs the sign inversion processing on the digitally converted data.

Then, after the "H" period of the read control scan line GLrd<N> in the read period Pdet<2>, the differential input switching signal SSW is controlled to "L". As a result, an electric charge corresponding to the predetermined offset voltage Voffset is charged to the second capacitive elements C2_1, C2_2, . . . , C2_M/P. At this time, the electric charge charged to the first capacitive elements C1_1, C1_2, . . . , C1_M/P is maintained.

In the "L" period of the differential input switching signal SSW after the "H" period of the read control scan line GLrd<N> during the read period Pdet<2>, more specifically, at a sampling timing H illustrated in FIG. 17, the A/D conversion circuit 43 converts a potential difference between the detection voltage V<2,N> charged to the first capacitive element C1_1 and the predetermined offset voltage Voffset charged to the second capacitive element C2_1 into a digital signal, a potential difference between the detection voltage V<P+2,N> of the detection element 3<P+2,N> charged to the first capacitive element C1_2 and the predetermined offset voltage Voffset charged to the second capacitive element C2_2 into a digital signal, and a potential difference between the detection voltage V<M−P+1,N> of the detection element 3<M−P+2,N> charged to the first capacitive element C1_M/P and the predetermined offset voltage Voffset charged to the second capacitive element C2_M/P into a digital signal.

In the read period Pdet<P>, the detection circuit 48 obtains digital data corresponding to a potential difference between the detection voltage of a detection element 3<P,n> coupled to the output signal line SL<P> and the detection voltage of a detection element 3<P,n+1>.

Specifically, the differential input switching signal SSW is controlled to "H" in the "H" period of the read control scan line GLrd<1> during the read period Pdet<P>. As a result, an electric charge corresponding to a detection voltage V<P,1> of a detection element 3<P,1> is charged to the first capacitive element C1_1, an electric charge corresponding to a detection voltage V<2P,1> of a detection element 3<2P,1> is charged to the first capacitive element C1_2, and the electric charge corresponding to the detection voltage V<M,1> of the detection element 3<M,1> is charged to the first capacitive element C1_M/P.

In the subsequent "H" period of the read control scan line GLrd<2>, the differential input switching signal SSW is controlled to "L". As a result, an electric charge according to a detection voltage V<P,2> of a detection element 3<P,2> is charged to the second capacitive element C2_1, an electric charge according to a detection voltage V<2P,2> of a detection element 3<2P,2> is charged to the second capacitive element C2_2, and an electric charge corresponding to the detection voltage V<M,2> of the detection element 3<M,2> is charged to the second capacitive element C2_M/P. At this time, the electric charge charged to the first capacitive elements C1_1, C1_2, . . . , C1_M/P is maintained.

In the "H" period of the read control scan line GLrd<2> during the read period Pdet<P>, more specifically, at a sampling timing I illustrated in FIG. 17, the A/D conversion circuit 43 converts a potential difference between a detection voltage V<P,1> charged to the first capacitive element C1_1 and a detection voltage V<P,2> charged to the second capacitive element C2_1 into a digital signal, a potential difference between the detection voltage V<2P,1> of the detection element 3<2P,1> charged to the first capacitive element C1_2 and the detection voltage V<2P,2> of the detection element 3<2P,2> charged to the second capacitive element C2_2 into a digital signal, and a potential difference between the detection voltage V<M,1> of the detection element 3<M,1> charged to the first capacitive element C1_M/P and a detection voltage V<M,2> of the detection element 3<M,2> charged to the second capacitive element C2_M/P into a digital signal.

In the subsequent "H" period of the read control scan line GLrd<3>, the differential input switching signal SSW is also controlled to "H". As a result, an electric charge corresponding to a detection voltage V<P,3> of a detection element 3<P,3> is charged to the first capacitive element C1_1, an electric charge corresponding to a detection voltage V<2P,3> of a detection element 3<2P,3> is charged to the first capacitive element C1_2, and the electric charge corresponding to the detection voltage V<M,3> of the detection element 3<M,3> is charged to the first capacitive element C1_M/P. At this time, the electric charge charged to the second capacitive elements C2_1, C2_2, . . . , C2_M/P is maintained.

In the "H" period of the read control scan line GLrd<3> during the read period Pdet<P>, more specifically, at a sampling timing J illustrated in FIG. 17, the A/D conversion circuit 43 converts a potential difference between the detection voltage V<P,3> charged to the first capacitive element C1_1 and the detection voltage V<P,2> charged to the second capacitive element C2_1 into a digital signal, a potential difference between the detection voltage V<2P,3> of the detection element 3<2P,3> charged to the first capacitive element C1_2 and the detection voltage V<2P,2> of the detection element 3<2P,2> charged to the second capacitive element C2_2 into a digital signal, and a potential difference between the detection voltage V<M,3> of the detection element 3<M,3> charged to the first capacitive element C1_M/P and the detection voltage V<M,2> of the detection element 3<M,2> charged to the second capacitive element C2_M/P into a digital signal. The subsequent digital signal processing circuit (for example, signal processing circuit 44) performs the sign inversion processing on the digitally converted data.

The differential input switching signal SSW is controlled to "H" during the "H" period of the read control scan line GLrd<N> in the read period Pdet<P>. As a result, an electric charge corresponding to a detection voltage V<P,N> of the detection element 3<P, N> is charged to the first capacitive element C1_1, an electric charge corresponding to a detection voltage V<2P,N> of a detection element 3<2P,N> is charged to the first capacitive element C1_2, and an electric charge corresponding to the detection voltage V<M,N> of the detection element 3<M,N> is charged to the first capacitive element C1_M/P. At this time, the electric charge charged to the second capacitive elements C2_1, C2_2, . . . , C2_M/P is maintained.

In the "H" period of the read control scan line GLrd<N> during the read period Pdet<P>, more specifically, at a sampling timing K illustrated in FIG. 17, the A/D conversion circuit 43 converts a potential difference between the detection voltage V<P,N> charged to the first capacitive element C1_1 and a detection voltage V<P,N−1> charged to the second capacitive element C2_1 into a digital signal, a potential difference between the detection voltage V<2P,N> of the detection element 3<2P,N> charged to the first capacitive element C1_2 and a detection voltage V<2P,N−1> of a detection element 3<2P,N−1> charged to the second capacitive element C2_2 into a digital signal, and a potential difference between the detection voltage V<M,N> of the detection element 3<M,N> charged to the first capacitive element C1_M/P and a detection voltage V<M,N−1> of a detection element 3<M,N−1> charged to the second capacitive element C2_M/P into a digital signal. The subsequent digital signal processing circuit (for example, signal processing circuit 44) performs the sign inversion processing on the digitally converted data.

Then, after the "H" period of the read control scan line GLrd<N> in the read period Pdet<P>, the differential input switching signal SSW is controlled to "L". As a result, an electric charge corresponding to the predetermined offset voltage Voffset is charged to the second capacitive elements C2_1, C2_2, . . . , C2_M/P. At this time, the electric charge charged to the first capacitive elements C1_1, C1_2, . . . , C1_M/P is maintained.

In the "L" period of the differential input switching signal SSW after the "H" period of the read control scan line GLrd<N> during the read period Pdet<P>, more specifically, at a sampling timing L illustrated in FIG. 17, the A/D conversion circuit 43 converts a potential difference between the detection voltage V<P,N> charged to the first capacitive element C1_1 and the predetermined offset voltage Voffset charged to the second capacitive element C2_1 into a digital signal, a potential difference between the detection voltage V<2P,N> of the detection element 3<2P,N> charged to the first capacitive element C1_2 and the predetermined offset voltage Voffset charged to the second capacitive element C2_2 into a digital signal, and a potential difference between the detection voltage V<M,N> of the detection element 3<M,N> charged to the first capacitive element C1_M/P and the predetermined offset voltage Voffset charged to the second capacitive element C2_M/P into a digital signal.

Thus, in the configuration illustrated in FIG. 16, the digital data corresponding to the potential difference of the detection voltage between two adjacent detection elements 3 in the second direction Dy can be obtained by repeating the combination of reset period Prst, exposure period Pch, and read period Pdet for P cycles in a detection period FP.

FIG. 18 is a diagram illustrating a correspondence relationship of digital data acquired at each sampling timing of the timing chart illustrated in FIG. 17. FIG. 19 is a diagram illustrating an example of digital data acquired during the detection operation of the signal line selection circuit and the detection circuit according to the first embodiment.

In the configuration illustrated in FIG. 16, after the signal line selection signal ASW<p> is set to "L" (low level voltage) during the read period Pdet<p>, the signal line selection signal ASW<add> is set to "H" (high level voltage) and the predetermined offset voltage Voffset is supplied to the detection circuit 48. Therefore, as illustrated in FIG. 19, the number of data in the column direction (second direction Dy, vertical direction illustrated in FIG. 19) is N, the same number as the number of detection elements 3 arranged in the column direction (second direction Dy).

FIG. 20A is a schematic diagram illustrating an example of detection values for each detection element. FIG. 20B is a schematic diagram illustrating an example of pre-exposure values of the detection values illustrated in FIG. 20A. FIG. 21 is a schematic diagram illustrating difference values between the detection values of the detection elements adjacent to each other in the column direction illustrated in FIG. 20A. As illustrated in FIGS. 20A and 20B, the detection value for each detection element changes from a value before exposure (in the example illustrated in FIG. 20B, "10") to a value corresponding to the irradiated light (refer to FIG. 20A) after the exposure period Pch.

A detection value V(n) for each detection element illustrated in FIG. 20A corresponds to the digital data for each detection element obtained by the detection device according to the comparative example described above. A difference value $\Delta V(n)=V(n)-V(n+1)$ between adjacent detection elements in the column direction illustrated in FIG. 21 corresponds to the digital data obtained by the detection device 1 according to the first embodiment.

In FIGS. 20A, 20B, and 21, the number of detection elements 3 arranged in the column direction (second direction Dy) is 13. The offset voltage Voffset in the present disclosure corresponds to a detection value V(14) illustrated in FIGS. 20A, 20B, and 21. The detection value V(14) corresponding to the offset voltage Voffset may be a value corresponding to the pre-exposure value of each detection element (for example, "10"), as illustrated in FIGS. 20A and 20B.

An image drawn by the difference value $\Delta V(n)$ between adjacent detection elements in the column direction illustrated in FIG. 21 is different from an image drawn by the detection value V(n) for each detection element illustrated in FIG. 20A. Therefore, in order to obtain an image equivalent to an image drawn by the digital data obtained by the configuration and operation illustrated in FIGS. 7 and 8 according to the comparative example, it is necessary to perform a predetermined processing on the digital data obtained by the configuration and operation illustrated in FIGS. 16 and 17 according to the first embodiment. The following describes a method for decoding the image drawn by the detection values for each detection element 3 obtained by the configuration and operation illustrated in FIGS. 7 and 8 according to the comparative example from the detection values obtained by the configuration and operation according to the first embodiment.

FIG. 22 is a diagram explaining image decoding processing in the detection device according to the first embodiment. In the present embodiment, a detection value V(n)' after image decoding is calculated using equations (1) and (2) below. In the following equations (1) and (2), N indicates the number of detection elements 3 arranged in the column direction (second direction Dy). n is a natural number less than or equal to N.

$$V(n)'=V(n+1)'+\Delta V(n) \quad (1)$$

$$V(N+1)'=0 \quad (2)$$

Here, a detection value V(N)' of the N-th row can be expressed by the following equation (3) using the above equation (1).

$$V(N)'=V(N+1)'+\Delta V(N) \quad (3)$$

Here, since the number of detection element 3 arranged in the column direction (second direction Dy) is N, "V(N+1)'", which is defined as the data of the N+1-th row in the above equation (3), is defined to Null (=0) as described in (2) above.

By using the above equations (1) and (2), the detection value V(n)' after the image decoding can be expressed by the following equation (4).

$$V(n)'=V(n)-V\text{offset} \quad (4)$$

By using the above equations (1) and (2) to the difference values illustrated in FIG. 21, the image drawn by the detection values for each detection element 3 illustrated in FIG. 20A can be decoded.

FIG. 23A is a schematic diagram illustrating the detection values after image decoding by the detection device according to the first embodiment. FIG. 23B is a schematic diagram illustrating the detection values after image decoding when no offset voltage is defined.

When no offset voltage is defined and the number of data in the column direction (second direction Dy, vertical direction illustrated in FIG. 15) is N−1, that is, there is no detection value V(14) (=Voffset) illustrated in FIGS. 20A, 20B, and 21, the above equation (2) can be expressed by the following equation (5).

$$V(N)'=0 \quad (5)$$

In this case, by using the above equations (1) and (5), the detection value V(n)' after the image decoding can be expressed by the following equation (6).

$$V(n)'=V(n)-V(N-1) \quad (6)$$

In FIGS. 20A and 21, V(N−1) corresponds to V(13). In this case, as illustrated in FIG. 23B, the image drawn by the detection value V(n) for each detection element illustrated in FIG. 20A can not be decoded.

In the present disclosure, by defining the offset voltage Voffset corresponding to the detection value V(14) illustrated in FIGS. 20A and 21, the image drawn by the detection value V(n) for each detection element illustrated in FIG. 20A can be decoded, as illustrated in FIG. 23A.

The present disclosure describes the example in which a potential difference between the detection voltage V<m,N> of the detection element 3<m,N> of the N-th row and the predetermined offset voltage Voffset is used as the detection value of the N-th row. However, in an aspect of the present disclosure, for example in the reset period Prst provided immediately after the read period Pdet, when the reset transistor Mrst is turned on (into the conduction state) and the voltage of the node N1 rises to the reset voltage Vrst, the offset voltage Voffset may use the voltage (Vrst−Vthsf−Vrdon, refer to FIG. 6) of the detection signal Vdet1 output from the output signal line SL<m> or use the reference voltage Vref. For example, in an aspect of the present disclosure, an intermediate value between the reset voltage Vrst and the reference voltage Vref may be set as digital data in advance, and the digital data may be converted to an analog value to make the offset voltage Voffset.

The following describes the operation in the detector 40 according to the first embodiment.

The signal processing circuit 44 sequentially stores the digital data obtained in the detection period FP in the storage circuit 46 as a first detection value ΔV<m,n> corresponding to the detection element 3<m,n> in the m-th column and n-th row.

After the end of the detection period FP, the signal processing circuit 44 reads the first detection value ΔV<m,n> stored in the storage circuit 46 and calculates a second detection value V<m,n> corresponding to the detection element 3<m,n> in the m-th column and n-th row using the following equations (7) and (8).

$$V<m,n>'=V<m,n+1>'+\Delta V<m,n> \qquad (7)$$

$$V<m,N+1>'=0 \qquad (8)$$

The signal processing circuit 44 stores the calculated second detection value V<m,n> in the storage circuit 46. The coordinate extraction circuit 45 generates two-dimensional information (for example, an image) indicating the shape of the asperities on the surface of the finger Fg or the like based on the second detection value V<m,n> stored in the storage circuit 46. In an aspect of the present disclosure, the second detection value V<m,n> may be output to the coordinate extraction circuit 45 by the signal processing circuit 44 reads from the storage circuit 46 or the coordinate extraction circuit 45 reads directly from the storage circuit 46. Alternatively, in an aspect of the present disclosure, the signal processing circuit 44 may directly output the calculated second detection value V<m,n> to the coordinate extraction circuit 45 without going through the storage circuit 46.

Second Embodiment

The first embodiment describes the example of obtaining the digital data corresponding to the potential difference of the detection voltage between two adjacent detection elements 3 in the second direction Dy. The present embodiment describes an example of obtaining digital data corresponding to a potential difference of the detection voltage between two adjacent detection elements 3 in the first direction Dx.

Figure 24:
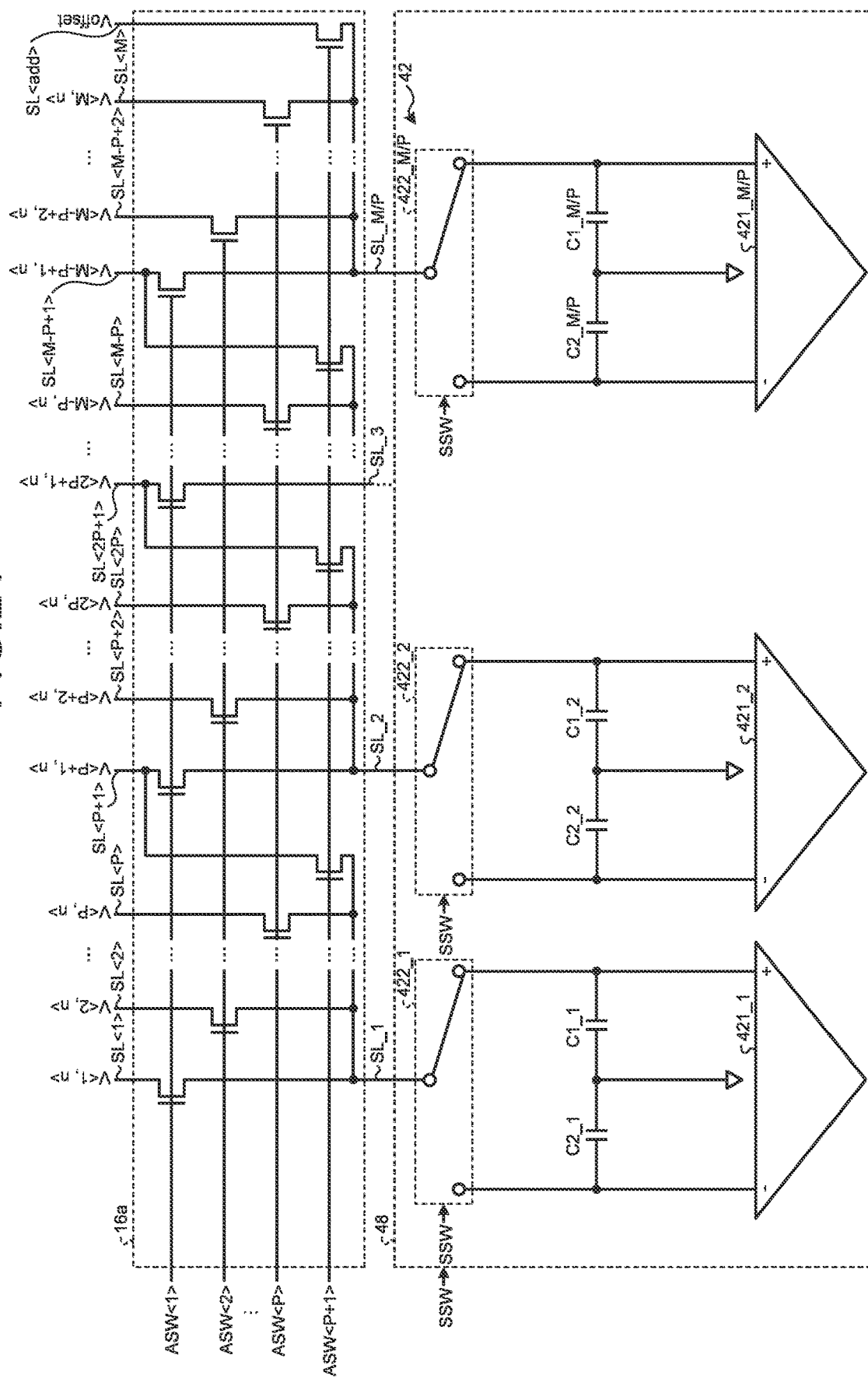
FIG. 24 is a diagram illustrating one configuration example of a signal line selection circuit and the detection circuit according to a second embodiment.
Figure 25:
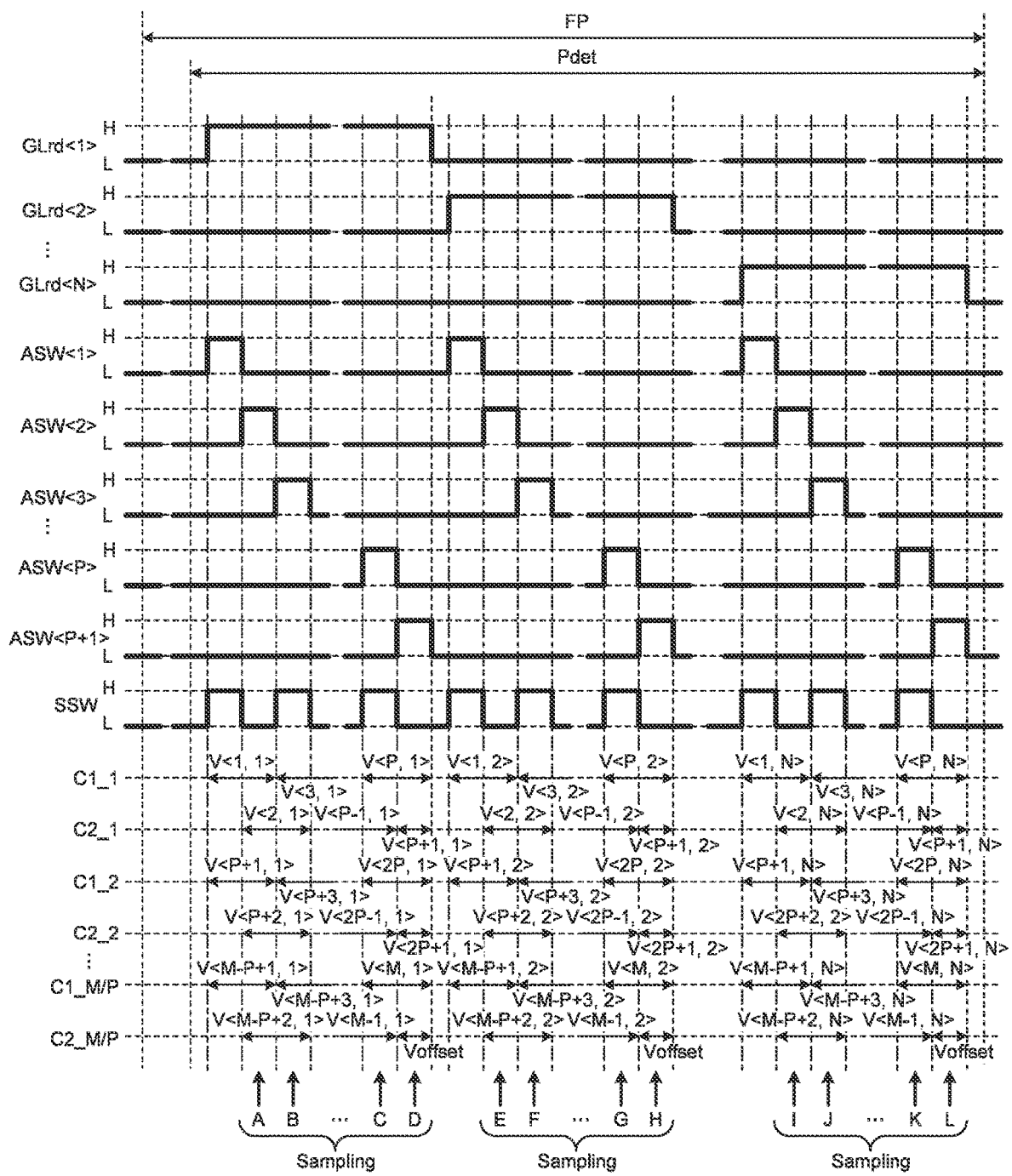
FIG. 25 is a diagram illustrating an example of a timing chart during a detection operation of a signal line selection circuit and a detection circuit according to the second embodiment.

FIG. 24 is a diagram illustrating one configuration example of a signal line selection circuit and the detection circuit according to the second embodiment. FIG. 25 is a diagram illustrating an example of a timing chart during a detection operation of the signal line selection circuit and the detection circuit according to the second embodiment. In FIG. 25, the reset period Prst and the exposure period Pch are omitted.

In the example illustrated in FIGS. 24 and 25, a signal line selection circuit 16a sequentially selects the output signal lines SL which is electrically coupled to the differential amplifying circuits 421_1, 421_2, . . . , 421_M/P along the first direction Dx, and couples the selected output signal line SL to the detection circuit 48 based on the signal line selection signals ASW<1>, ASW<2>, . . . , ASW<P>, ASW<P+1> (P is a natural number less than M/2) supplied from the detection control circuit 11.

In the present embodiment, the signal line selection circuit 16a selects the offset voltage supply signal line SL<add> for supplying the predetermined offset voltage Voffset to the differential amplifying circuit 421_M/P based on a signal line selection signal ASW<P+1> supplied from the detection control circuit 11, and the offset voltage supply signal line SL<add> is electrically coupled to the detection circuit 48. In an aspect of the present disclosure, the offset voltage supply signal line SL<add> does not necessarily need to be provided in the detection region AA, as long as the predetermined offset voltage Voffset can be supplied to the differential amplifying circuit 421_M/P.

The second gate line drive circuit 15B, in the read period Pdet of the detection period FP, sequentially selects the read control scan lines GLrd<1>, GLrd<2>, GLrd<3>, . . . , GLrd<N> and supplies the read control signal RD to the selected read control scan lines GLrd. In the "H" period of each read control scan line GLrd<1>, GLrd<2>, GLrd<3>, . . . , GLrd<N>, the detection control circuit 11 sequentially sets the signal line selection signals ASW<1>, ASW<2>, . . . , ASW<P>, ASW<P+1> to "H" (high level voltage).

The configuration of the detection circuit 48 according to the second embodiment is the same as that of the first embodiment illustrated in FIG. 16. Specifically, in the present embodiment, as in the first embodiment, one differential amplifying circuits 421_1, 421_2, . . . , 421_M/P is provided for each of the output signal lines SL<p>, SL<P+p>, . . . , SL<M−P+p> that are simultaneously selected by the signal line selection circuit 16a. The detection control circuit 11 switches the control state of the switch circuits 422_1, 422_2, . . . , 422_M/P of the detection circuit 48 in synchronization with the signal line selection signals ASW<1>, ASW<2>, . . . , ASW<P>, ASW<P+1>.

Specifically, the detection control circuit 11, for example, sets the differential input switching signal SSW to "H" (high level voltage) during the selection period of the output signal line SL<odd> in odd columns, and controls the non-inverting input (+) of the differential amplifying circuit 421 so that a detection voltage V<odd,n> of a detection element 3<odd,n> in the odd columns is applied.

The detection control circuit 11, for example, also sets the differential input switching signal SSW to "L" (low level voltage) during the selection period of the output signal line SL<even> in even columns, and controls the inverting input (−) of the differential amplifying circuit 421 so that a detection voltage V<even,n> of a detection element 3<even,n> in the even rows is applied.

When the differential input switching signal SSW is controlled to "H" during the selection period of the output signal line SL<1> in the "H" period of the read control scan line GLrd<1>, the electric charge according to the detection voltage V<1,1> of the detection element 3<1,1> is charged to the first capacitive element C1_1, the electric charge according to the detection voltage V<P+1,1> of the detection element 3<P+1,1> is charged to the first capacitive element C1_2, and the electric charge corresponding to the detection voltage V<M−P+1,1> of the detection element 3<M−P+1,1> is charged to the first capacitive element C1_M/P.

When the differential input switching signal SSW is controlled to "L" in the subsequent selection period of the output signal line SL<2>, the electric charge according to the detection voltage V<2,1> of the detection element 3<2,1> is charged to the second capacitive element C2_2, the electric charge according to the detection voltage V<P+2,1> of the detection element 3<P+2,1> is charged to the second capacitive element C2_2, and the electric charge according to the detection voltage V<M−P+2,1> of the detection element 3<M−P+2,1> is charged to the second capacitive element C2_M/P. At this time, the electric charge charged to the first capacitive elements C1_1, C1_2, . . . , C1_M/P is maintained.

In the selection period of the output signal line SL<2>, more specifically, at a sampling timing A illustrated in FIG. 25, the A/D conversion circuit 43 converts a potential difference between the detection voltage V<1,1> of the detection element 3<1,1> charged to the first capacitive element C1_1 and the detection voltage V<2,1> of the detection element 3<2,1> charged to the second capacitive element C2_1 into a digital signal, a potential difference between the detection voltage V<P+1,1> of the detection element 3<P+1,1> charged to the first capacitive element C1_2 and the detection voltage V<P+2,1> of the detection element 3<P+2,1> charged to the second capacitive element C2_2 into a digital signal, and a potential difference between the detection voltage V<M−P+1,1> of the detection element 3<M−P+1,1> charged to the first capacitive element C1_M/P and the detection voltage V<M−P+2,1> of the detection element 3<M−P+2,1> charged to the second capacitive element C2_M/P into a digital signal.

When the differential input switching signal SSW is controlled to "H" in the subsequent selection period of the output signal line SL<3>, an electric charge according to a detection voltage V<3,1> of a detection element 3<3,1> is charged to the first capacitive element C1_1, an electric charge according to a detection voltage V<P+3,1> of a detection element 3<P+3,1> is charged to the first capacitive element C13, and an electric charge according to a detection voltage V<M−P+3,1> of a detection element 3<M−P+3,1> is charged to the first capacitive element C1_M/P. At this time, the electric charge charged to the second capacitive elements C2_1, C2_2, . . . , C2_M/P is maintained.

In the selection period of the output signal line SL<3>, more specifically, at a sampling timing B illustrated in FIG. 25, the A/D conversion circuit 43 converts a potential difference between the detection voltage V<3,1> of the detection element 3<3,1> charged to the first capacitive element C1_1 and the detection voltage V<2,1> of the detection element 3<2,1> charged to the second capacitive element C2_1 into a digital signal, a potential difference between the detection voltage V<P+3,1> of the detection element 3<P+3,1> charged to the first capacitive element C1_2 and the detection voltage V<P+2,1> of the detection element 3<P+2,1> charged to the second capacitive element C2_2 into a digital signal, and a potential difference between the detection voltage V<M−P+3,1> of the detection element 3<M−P+3,1> charged to the first capacitive element C1_M/P and the detection voltage V<M−P+2,1> of the detection element 3<M−P+2,1> charged to the second capacitive element C2_M/P into a digital signal. The subsequent digital signal processing circuit (for example, signal processing circuit 44) performs the sign inversion processing on the digitally converted data.

When the differential input switching signal SSW is controlled to "H" in the selection period of the output signal line SL<P>, the electric charge according to the detection voltage V<P,1> of the detection element 3<P,1> is charged to the first capacitive element C1_1, the electric charge according to the detection voltage V<2P,1> of the detection element 3<2P,1> is charged to the first capacitive element C1_2, and the electric charge according to the detection voltage V<M,1> of the detection element 3<M,1> is charged to the first capacitive element C1_M/P. At this time, the electric charge charged to the second capacitive elements C2_1, C2_2, . . . , C2_M/P is maintained.

In the selection period of the output signal line SL<P>, more specifically, at a sampling timing C illustrated in FIG. 25, the A/D conversion circuit 43 converts a potential difference between the detection voltage V<P,1> of the detection element 3<P,1> charged to the first capacitive element C1_1 and a detection voltage V<P−1,1> of a detection element 3<P−1,1> charged to the second capacitive element C2_1 into a digital signal, a potential difference between the detection voltage V<2P,1> of the detection element 3<2P,1> charged to the first capacitive element C1_2 and a detection voltage V<2P−1,1> of the detection element 3<2P−1,1> charged to the second capacitive element C2_2 into a digital signal, and a potential difference between the detection voltage V<M,1> of the detection element 3<M,1> charged to the first capacitive element C1_M/P and a detection voltage V<M−1,1> of a detection element 3<M−1,1> charged to the second capacitive element C2_M/P into a digital signal. The subsequent digital signal processing circuit (for example, signal processing circuit 44) performs the sign inversion processing on the digitally converted data.

When the differential input switching signal SSW is controlled to "L" in the subsequent selection period of an output signal line SL<P+1>, the electric charge according to the detection voltage V<P+1,1> of the detection element 3<P+1,1> is charged to the second capacitive element C2_2, an electric charge according to the detection voltage V<2P+1,1> of the detection element 3<2P+1,1> is charged to the second capacitive element C2_2, and the electric charge according to the predetermined offset voltage Voffset is charged to the second capacitive element C2_M/P. At this time, the electric charge charged to the first capacitive elements C1_1, C1_2, . . . , C1_M/P is maintained.

In the selection period of the output signal line SL<P+1>, more specifically, at a sampling timing D illustrated in FIG. 25, the A/D conversion circuit 43 converts a potential difference between the detection voltage V<P,1> of the detection element 3<P,1> charged to the first capacitive element C1_1 and the detection voltage V<P+1,1> of the detection element 3<P+1,1> charged to the second capacitive element C2_1 into a digital signal, a potential difference between the detection voltage V<2P,1> of the detection element 3<2P,1> charged to the first capacitive element C1_2 and the detection voltage V<2P+1,1> of the detection element 3<2P+1,1> charged to the second capacitive element C2_2 into a digital signal, and a potential difference between the detection voltage V<M,1> of the detection element 3<M,1> charged to the first capacitive element C1_M/P and the predetermined offset voltage Voffset charged to the second capacitive element C2_M/P into a digital signal.

When the differential input switching signal SSW is controlled to "H" during the selection period of the output signal line SL<1> in the "H" period of the read control scan line GLrd<2>, the electric charge according to the detection voltage V<1,2> of the detection element 3<1,2> is charged to the first capacitive element C1_1, the electric charge according to the detection voltage V<P+1,2> of the detection element 3<P+1,2> is charged to the first capacitive element C1_2, and the electric charge corresponding to the detection voltage V<M−P+1,2> of the detection element 3<M−P+1,2> is charged to the first capacitive element C1_M/P.

When the differential input switching signal SSW is controlled to "L" in the subsequent selection period of the output signal line SL<2>, the electric charge according to the detection voltage V<2,2> of the detection element 3<P+2,2> is charged to the second capacitive element C2_2, the electric charge according to the detection voltage V<P+2,2> of the detection element 3<P+2,2> is charged to the second capacitive element C2_2, and the electric charge according to the detection voltage V<M−P+2,2> of the detection element 3<M−P+2,2> is charged to the second capacitive element C2_M/P. At this time, the electric charge charged to the first capacitive elements C1_1, C1_2, . . . , C1_M/P is maintained.

In the selection period of the output signal line SL<2>, more specifically, at a sampling timing E illustrated in FIG.

25, the A/D conversion circuit 43 converts a potential difference between the detection voltage V<1,2> of the detection element 3<1,2> charged to the first capacitive element C1_1 and the detection voltage V<2,2> of the detection element 3<2,2> charged to the second capacitive element C2_1 into a digital signal, a potential difference between the detection voltage V<P+1,2> of the detection element 3<P+1,2> charged to the first capacitive element C1_2 and the detection voltage V<P+2,2> of the detection element 3<P+2,2> charged to the second capacitive element C2_2 into a digital signal, and a potential difference between the detection voltage V<M−P+1,2> of the detection element 3<M−P+1,2> charged to the first capacitive element C1_M/P and the detection voltage V<M−P+2,2> of the detection element 3<M−P+2,2> charged to the second capacitive element C2_M/P into a digital signal.

When the differential input switching signal SSW is controlled to "H" in the subsequent selection period of the output signal line SL<3>, an electric charge according to a detection voltage V<3,2> of a detection element 3<3,2> is charged to the first capacitive element C1_1, an electric charge according to a detection voltage V<P+3,2> of a detection element 3<P+3,2> is charged to the first capacitive element C13, and an electric charge according to a detection voltage V<M−P+3,2> of a detection element 3<M−P+3,2> is charged to the first capacitive element C1_M/P. At this time, the electric charge charged to the second capacitive elements C2_1, C2_2, . . . , C2_M/P is maintained.

In the selection period of the output signal line SL<3>, more specifically, at a sampling timing F illustrated in FIG. 25, the A/D conversion circuit 43 converts a potential difference between the detection voltage V<3,2> of the detection element 3<3,2> charged to the first capacitive element C1_1 and the detection voltage V<2,2> of the detection element 3<2,2> charged to the second capacitive element C2_1 into a digital signal, a potential difference between the detection voltage V<P+3,2> of the detection element 3<P+3,2> charged to the first capacitive element C1_2 and the detection voltage V<P+2,2> of the detection element 3<P+2,2> charged to the second capacitive element C2_2 into a digital signal, and a potential difference between the detection voltage V<M−P+3,2> of the detection element 3<M−P+3,2> charged to the first capacitive element C1_M/P and the detection voltage V<M−P+2,2> of the detection element 3<M−P+2,2> charged to the second capacitive element C2_M/P into a digital signal. The subsequent digital signal processing circuit (for example, signal processing circuit 44) performs the sign inversion processing on the digitally converted data.

When the differential input switching signal SSW is controlled to "H" in the selection period of the output signal line SL<P>, the electric charge according to the detection voltage V<P,2> of the detection element 3<P,2> is charged to the first capacitive element C1_1, the electric charge according to the detection voltage V<2P,2> of the detection element 3<2P,2> is charged to the first capacitive element C1_2, and the electric charge according to the detection voltage V<M,2> of the detection element 3<M,2> is charged to the first capacitive element C1_M/P. At this time, the electric charge charged to the second capacitive elements C2_1, C2_2, . . . , C2_M/P is maintained.

In the selection period of the output signal line SL<P>, more specifically, at a sampling timing G illustrated in FIG. 25, the A/D conversion circuit 43 converts a potential difference between the detection voltage V<P,2> of the detection element 3<P,2> charged to the first capacitive element C1_1 and a detection voltage V<P−1,2> of a detection element 3<P−1,2> charged to the second capacitive element C2_1 into a digital signal, a potential difference between the detection voltage V<2P,2> of the detection element 3<2P,2> charged to the first capacitive element C1_2 and a detection voltage V<2P−1,2> of the detection element 3<2P−1,2> charged to the second capacitive element C2_2 into a digital signal, and a potential difference between the detection voltage V<M,2> of the detection element 3<M,2> charged to the first capacitive element C1_M/P and a detection voltage V<M−1,2> of a detection element 3<M−1,2> charged to the second capacitive element C2_M/P into a digital signal. The subsequent digital signal processing circuit (for example, signal processing circuit 44) performs the sign inversion processing on the digitally converted data.

When the differential input switching signal SSW is controlled to "L" in the subsequent selection period of the output signal line SL<P+1>, the electric charge according to the detection voltage V<P+1,2> of the detection element 3<P+1,2> is charged to the second capacitive element C2_2, an electric charge according to a detection voltage V<2P+1,2> of a detection element 3<2P+1,2> is charged to the second capacitive element C2_2, and the electric charge according to the predetermined offset voltage Voffset is charged to the second capacitive element C2_M/P. At this time, the electric charge charged to the first capacitive elements C1_1, C1_2, . . . , C1_M/P is maintained.

In the selection period of the output signal line SL<P+1>, more specifically, at a sampling timing H illustrated in FIG. 25, the A/D conversion circuit 43 converts a potential difference between the detection voltage V<P,2> of the detection element 3<P,2> charged to the first capacitive element C1_1 and the detection voltage V<P+1,2> of the detection element 3<P+1,2> charged to the second capacitive element C2_1 into a digital signal, a potential difference between the detection voltage V<2P,2> of the detection element 3<2P,2> charged to the first capacitive element C1_2 and the detection voltage V<2P+1,2> of the detection element 3<2P+1,2> charged to the second capacitive element C2_2 into a digital signal, and a potential difference between the detection voltage V<M,2> of the detection element 3<M,2> charged to the first capacitive element C1_M/P and the predetermined offset voltage Voffset charged to the second capacitive element C2_M/P into a digital signal.

When the differential input switching signal SSW is controlled to "H" during the selection period of the output signal line SL<1> in the "H" period of the read control scan line GLrd<N>, the electric charge according to the detection voltage V<1,N> of the detection element 3<1,N> is charged to the first capacitive element C1_1, the electric charge according to the detection voltage V<P+1,N> of the detection element 3<P+1,N> is charged to the first capacitive element C1_2, and the electric charge corresponding to the detection voltage V<M−P+1,N> of the detection element 3<M−P+1,N> is charged to the first capacitive element C1_M/P.

When the differential input switching signal SSW is controlled to "L" in the subsequent selection period of the output signal line SL<2>, the electric charge according to the detection voltage V<2,N> of the detection element 3<P+2,N> is charged to the second capacitive element C2_2, the electric charge according to the detection voltage V<P+2,N> of the detection element 3<P+2,N> is charged to the second capacitive element C2_2, and the electric charge according to the detection voltage V<M−P+2,N> of the detection element 3<M−P+2,N> is charged to the second capacitive element C2_M/P. At this time, the electric charge charged to the first capacitive elements C1_1, C1_2, ..., C1_M/P is maintained.

In the selection period of the output signal line SL<2>, more specifically, at a sampling timing I illustrated in FIG. 25, the A/D conversion circuit 43 converts a potential difference between the detection voltage V<1,N> of the detection element 3<1,N> charged to the first capacitive element C1_1 and the detection voltage V<2,N> of the detection element 3<2,N> charged to the second capacitive element C2_1 into a digital signal, a potential difference between the detection voltage V<P+1,N> of the detection element 3<P+1,N> charged to the first capacitive element C1_2 and the detection voltage V<P+2,N> of the detection element 3<P+2,N> charged to the second capacitive element C2_2 into a digital signal, and a potential difference between the detection voltage V<M−P+1,N> of the detection element 3<M−P+1,N> charged to the first capacitive element C1_M/P and the detection voltage V<M−P+2,N> of the detection element 3<M−P+2,N> charged to the second capacitive element C2_M/P into a digital signal.

When the differential input switching signal SSW is controlled to "H" in the subsequent selection period of the output signal line SL<3>, an electric charge according to a detection voltage V<3,N> of a detection element 3<3,N> is charged to the first capacitive element C1_1, an electric charge according to a detection voltage V<P+3,N> of a detection element 3<P+3,N> is charged to the first capacitive element C13, and an electric charge according to a detection voltage V<M−P+3,N> of a detection element 3<M−P+3,N> is charged to the first capacitive element C1_M/P. At this time, the electric charge charged to the second capacitive elements C2_1, C2_2, ..., C2_M/P is maintained.

In the selection period of the output signal line SL<3>, more specifically, at a sampling timing J illustrated in FIG. 25, the A/D conversion circuit 43 converts a potential difference between the detection voltage V<3,N> of the detection element 3<3,N> charged to the first capacitive element C1_1 and the detection voltage V<2,N> of the detection element 3<2,N> charged to the second capacitive element C2_1 into a digital signal, a potential difference between the detection voltage V<P+3,N> of the detection element 3<P+3,N> charged to the first capacitive element C1_2 and the detection voltage V<P+2,N> of the detection element 3<P+2,N> charged to the second capacitive element C2_2 into a digital signal, and a potential difference between the detection voltage V<M−P+3,N> of the detection element 3<M−P+3,N> charged to the first capacitive element C1_M/P and the detection voltage V<M−P+2,N> of the detection element 3<M−P+2,N> charged to the second capacitive element C2_M/P into a digital signal. The subsequent digital signal processing circuit (for example, signal processing circuit 44) performs the sign inversion processing on the digitally converted data.

When the differential input switching signal SSW is controlled to "H" in the selection period of the output signal line SL<P>, the electric charge according to the detection voltage V<P,N> of the detection element 3<P,N> is charged to the first capacitive element C1_1, the electric charge according to the detection voltage V<2P,N> of the detection element 3<2P,N> is charged to the first capacitive element C1_2, and the electric charge according to the detection voltage V<M,N> of the detection element 3<M,N> is charged to the first capacitive element C1_M/P. At this time, the electric charge charged to the second capacitive elements C2_1, C2_2, ..., C2_M/P is maintained.

In the selection period of the output signal line SL<P>, more specifically, at a sampling timing K illustrated in FIG. 25, the A/D conversion circuit 43 converts a potential difference between the detection voltage V<P,N> of the detection element 3<P,N> charged to the first capacitive element C1_1 and a detection voltage V<P−1,N> of the detection element 3<P−1,N> charged to the second capacitive element C2_1 into a digital signal, a potential difference between the detection voltage V<2P,N> of the detection element 3<2P,N> charged to the first capacitive element C1_2 and a detection voltage V<2P−1,N> of a detection element 3<2P−1,N> charged to the second capacitive element C2_2 into a digital signal, and a potential difference between the detection voltage V<M,N> of the detection element 3<M,N> charged to the first capacitive element C1_M/P and a detection voltage V<M−1,N> of a detection element 3<M−1,N> charged to the second capacitive element C2_M/P into a digital signal. The subsequent digital signal processing circuit (for example, signal processing circuit 44) performs the sign inversion processing on the digitally converted data.

When the differential input switching signal SSW is controlled to "L" in the subsequent selection period of the output signal line SL<P+1>, the electric charge according to the detection voltage V<P+1,N> of the detection element 3<P+1,N> is charged to the second capacitive element C2_2, an electric charge according to a detection voltage V<2P+1,N> of a detection element 3<2P+1,N> is charged to the second capacitive element C2_2, and the electric charge according to the predetermined offset voltage Voffset is charged to the second capacitive element C2_M/P. At this time, the electric charge charged to the first capacitive elements C1_1, C1_2, ..., C1_M/P is maintained.

In the selection period of the output signal line SL<P+1>, more specifically, at a sampling timing L illustrated in FIG. 25, the A/D conversion circuit 43 converts a potential difference between the detection voltage V<P,N> of the detection element 3<P,N> charged to the first capacitive element C1_1 and the detection voltage V<P+1,N> of the detection element 3<P+1,N> charged to the second capacitive element C2_1 into a digital signal, a potential difference between the detection voltage V<2P,N> of the detection element 3<2P,N> charged to the first capacitive element C1_2 and the detection voltage V<2P+1,N> of the detection element 3<2P+1,N> charged to the second capacitive element C2_2 into a digital signal, and the potential difference between the detection voltage V<M,N> of the detection element 3<M,N> charged to the first capacitive element C1_M/P and the predetermined offset voltage Voffset charged to the second capacitive element C2_M/P into a digital signal.

FIG. 26 is a diagram illustrating a correspondence relationship of digital data acquired at each sampling timing of the timing chart illustrated in FIG. 25. FIG. 27 is a diagram illustrating an example of digital data acquired during the detection operation of the signal line selection circuit and the detection circuit according to the second embodiment.

FIG. 27 illustrates an example of digital data when the Gain (amplification) of the differential amplifying circuit 421 is "1". In FIG. 27, for example, the digital data corresponding to a potential difference between the detection element 3<m,n> and a detection element 3<m+1,n> is indicated by "V<m,n>−V<m+1,n>".

In the configuration illustrated in FIG. 24, the predetermined offset voltage Voffset is supplied to the differential amplifying circuit 421_M/P of the detection circuit 48 based on the signal line selection signal ASW<P+1> supplied from the detection control circuit 11 in the selection period of the output signal line SL<P+1>. Therefore, as illustrated in FIG. 27, the number of data in the row direction (first direction Dx, horizontal direction shown in FIG. 27) is M, the same number as the number of detection elements 3 arranged in the row direction (first direction Dx).

Figure 29:
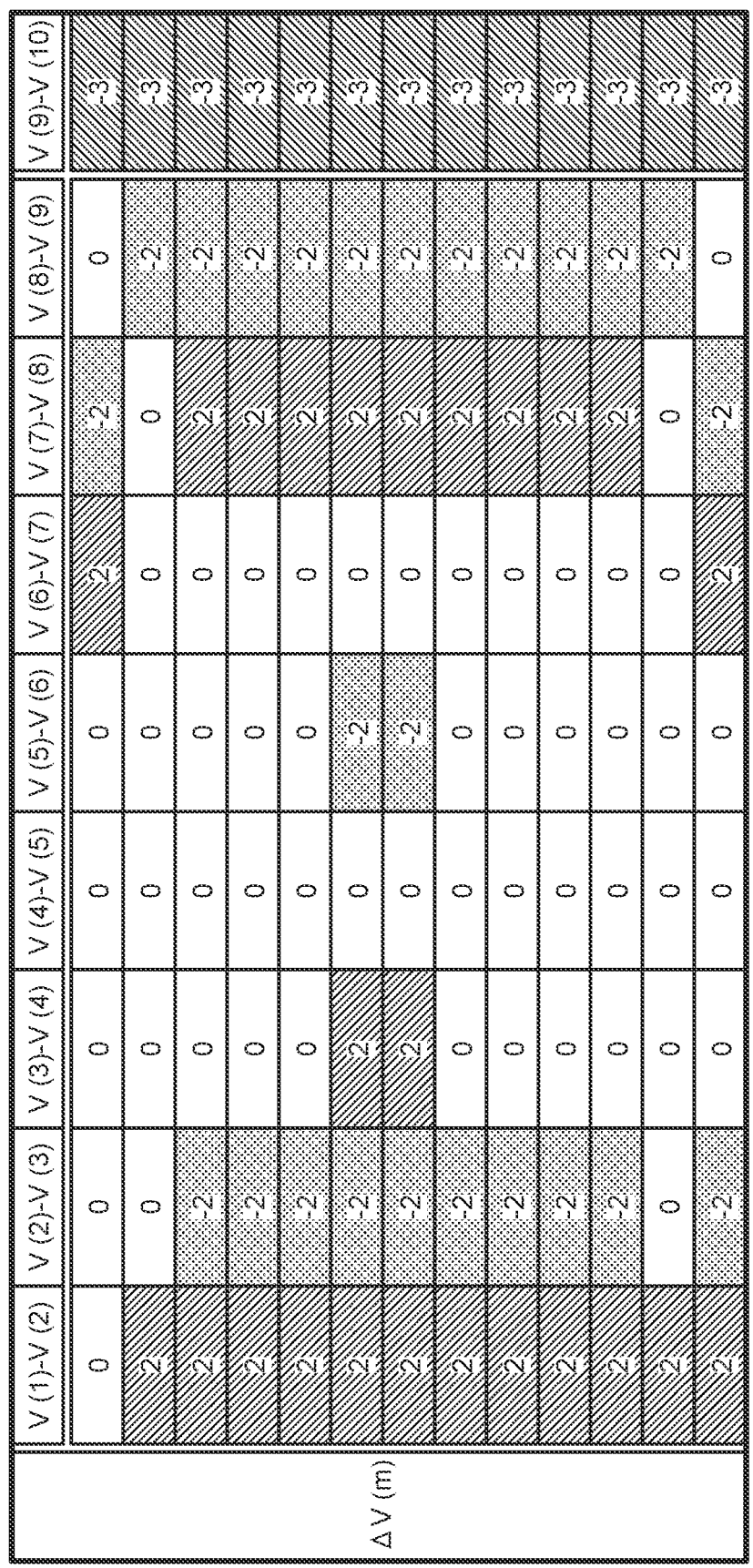
FIG. 29 is a schematic diagram illustrating difference values between the detection values of the detection elements adjacent to each other in the row direction illustrated in FIG. 28.

FIG. 28 is a schematic diagram illustrating an example of detection values for each detection element. FIG. 29 is a schematic diagram illustrating difference values between the detection values of the detection elements adjacent to each other in the row direction illustrated in FIG. 28.

A detection value V(m) for each detection element illustrated in FIG. 28 corresponds to the digital data for each detection element obtained by the detection device for the comparative example described above. A difference value $\Delta V(m)=V(m)-V(m+1)$ between adjacent detection elements in the row direction illustrated in FIG. 29 corresponds to the digital data obtained by the detection device 1 according to the second embodiment.

In FIGS. 28 and 29, the number of detection elements 3 arranged in the row direction (first direction Dx) is 9. The offset voltage Voffset in the present disclosure corresponds to a detection value V(10) illustrated in FIGS. 28 and 29.

An image drawn by the difference value $\Delta V(m)$ between adjacent detection elements in the row direction illustrated in FIG. 29 is different from an image drawn by the detection value V(m) for each detection element illustrated in FIG. 28. Therefore, in order to obtain an image equivalent to an image drawn by the digital data obtained by the configuration and operation illustrated in FIGS. 7 and 8 according to the comparative example, it is necessary to perform a predetermined processing on the digital data obtained by the configuration and operation illustrated in FIGS. 24 and 25 according to the second embodiment. The following describes a method for decoding the image drawn by the detection values for each detection element 3 obtained by the configuration and operation illustrated in FIGS. 7 and 8 according to the comparative example from the detection values obtained by the configuration and operation according to the second embodiment.

FIG. 30 is a diagram explaining image decoding processing in the detection device according to the second embodiment. In the present embodiment, a detection value V(m)' after image decoding is calculated using equations (9) and (10) below. In the following equations (9) and (10), M indicates the number of detection elements 3 arranged in the row direction (first direction Dx). m is a natural number less than or equal to M.

$$V(m)'=V(m+1)'+\Delta V(m) \quad (9)$$

$$V(M+1)'=0 \quad (10)$$

Here, a detection value V(M)' of the M-th column can be expressed by the following equation (11) using the above equation (9).

$$V(M)'=V(M+1)'+\Delta V(M) \quad (11)$$

Here, since the number of detection element 3 arranged in the row direction (first direction Dx) is M, "V(M+1)'", which is defined as the data of the M+1-th column in the above equation (11), is defined to Null (=0) as described in (10) above.

By using the above equations (9) and (10), the detection value V(m)' after the image decoding can be expressed by the following equation (12).

$$V(m)'=V(m)-Voffset \quad (12)$$

By using the above equations (9) and (10) to the difference values illustrated in FIG. 29, the image drawn by the detection values for each detection element 3 illustrated in FIG. 28 can be decoded as illustrated in FIG. 31. FIG. 31 is a schematic diagram illustrating the detection values after image decoding by the detection device according to the second embodiment.

In the present disclosure, by defining the offset voltage Voffset corresponding to the detection value V(10) illustrated in FIGS. 28 and 29, the image drawn by the detection value V(m) for each detection element illustrated in FIG. 28 can be decoded, as illustrated in FIG. 31.

The present disclosure describes the example in which the potential difference between the detection voltage V<M,n> of the detection element 3<M,n> of the M-th column and the predetermined offset voltage Voffset is used as the detection value of the M-th column. However, the offset voltage Voffset, for example, may have an aspect of using the reset voltage Vrst or the reference voltage Vref. For example, in an aspect of the present disclosure, an intermediate value between the reset voltage Vrst and the reference voltage Vref may be set as digital data in advance, and the digital data may be converted to the analog value to make the offset voltage Voffset.

The following describes the operation in the detector 40 according to the second embodiment.

The signal processing circuit 44 sequentially stores the digital data obtained in the detection period FP in the storage circuit 46 as a first detection value $\Delta V<m,n>$ corresponding to the detection element 3<m,n> in the m-th column and n-th row.

After the end of the detection period FP, the signal processing circuit 44 reads the first detection value $\Delta V<m,n>$ stored in the storage circuit 46 and calculates a second detection value V<m,n> corresponding to the detection element 3<m,n> in the m-th column and n-th row using the following equations (13) and (14).

$$V<m,n>'=V<m+1,n>'+\Delta V<m,n> \quad (13)$$

$$V<M+1,n>'=0 \quad (14)$$

The signal processing circuit 44 stores the calculated second detection value V<m,n> in the storage circuit 46. The coordinate extraction circuit 45 generates two-dimensional information (for example, an image) indicating the shape of the asperities on the surface of the finger Fg or the like based on the second detection value V<m,n> stored in the storage circuit 46. In an aspect of the present disclosure, the second detection value V<m,n> may be output to the coordinate extraction circuit 45 by the signal processing circuit 44 reads from the storage circuit 46 or the coordinate extraction circuit 45 reads directly from the storage circuit 46. Alternatively, in an aspect of the present disclosure, the signal processing circuit 44 may directly output the calculated second detection value V<m,n> to the coordinate extraction circuit 45 without going through the storage circuit 46.

While the preferred embodiments of the present disclosure have been described above, the present disclosure is not limited to the embodiments described above. The content disclosed in the embodiments is merely an example, and can be variously modified within the scope not departing from the gist of the present disclosure. Any modification appropriately made within the scope not departing from the gist of the present disclosure also naturally belongs to the technical scope of the present disclosure.

What is claimed is:

1. A detection device comprising:
a sensor area in which a plurality of detection elements including photoelectric conversion elements are arranged in a matrix having a row-column configuration within a detection region; and
a detector configured to calculate a detection value corresponding to the detection elements based on a voltage generated in the detection elements, wherein
in the detection region of the sensor area, a number of detection elements arranged in a first direction is M, and a number of detection elements arranged in a second direction different from the first direction is N, and
the detector regards a potential difference $\Delta V{<}m,n{>}$ between a voltage $V{<}m,n{>}$ of the detection element in an m-th column and an n-th row arranged in the m-th column (m is a natural number less than or equal to M) in the first direction and arranged in the n-th row (n is a natural number less than or equal to N) in the second direction, and a voltage $V{<}m,n+1{>}$ of the detection element in the m-th column and an n+1-th row arranged in the m-th column in the first direction and arranged in the n+1-th row in the second direction, as a first detection value corresponding to the detection element in the m-th column and n-th row, and calculates a second detection value $V{<}m,n{>}'$ corresponding to the detection element in the m-th column and n-th row using the following equations (1) and (2):

$$V{<}m,n{>}'=V{<}m,n+1{>}'+\Delta V{<}m,n{>} \quad (1)$$

$$V{<}m,N+1{>}'=0 \quad (2).$$

2. The detection device according to claim 1, wherein the detector regards a potential difference $\Delta V{<}m,N{>}$ between a voltage $V{<}m,N{>}$ of the detection element in the m-th column and an N-th row arranged in the m-th column in the first direction and arranged in the N-th row in the second direction, and a predetermined offset voltage, as a first detection value corresponding to the detection element in the m-th column and N-th row, and calculates the second detection value $V{<}m,N{>}'$.

3. The detection device according to claim 2, further comprising:
a read control scan line configured to supply a read control signal to the detection elements arranged in the first direction;
a drive circuit configured to sequentially select the read control scan line along the second direction; and
an output signal line that is supplied with a voltage generated in the detection elements arranged in the second direction, wherein
the detector is electrically coupled to the output signal line.

4. The detection device according to claim 3, wherein the detector includes:
a differential amplifying circuit configured to output a potential difference between the voltages generated in the detection elements adjacent in the second direction;
a first capacitive element coupled to a non-inverting input of the differential amplifying circuit;
a second capacitive element coupled to an inverting input of the differential amplifying circuit; and
a switch circuit configured to switch the non-inverting input and the inverting input of the differential amplifying circuit in synchronization with selection switching of the read control scan line and electrically couple to the output signal line.

5. The detection device according to claim 4, wherein the differential amplifying circuit outputs a potential difference between a voltage charged to the first capacitive element and a voltage charged to the second capacitive element.

6. The detection device according to claim 4, wherein the detector inverts a sign of a first detection value $\Delta V{<}m,n+1{>}$ with respect to a first detection value $\Delta V{<}m,n{>}$.

7. The detection device according to claim 6, further comprising a signal line selection circuit configured to simultaneously select a plurality of output signal lines among all output signal lines within the detection region and electrically couple to the detector, wherein
the detector is provided with one differential amplifying circuit for each of the output signal lines that are simultaneously selected by the signal line selection circuit.

8. The detection device according to claim 4, wherein the differential amplifying circuit amplifies and outputs a potential difference between a voltage generated in a first detection element and a voltage generated in a second detection element adjacent to the first detection element in the second direction within the detection region.

9. The detection device according to claim 1, wherein the detection element includes:
a reset transistor configured to apply a reset voltage to a cathode of the photoelectric conversion element;
a source follower transistor configured to output a signal corresponding to a voltage generated by the photoelectric conversion element; and
a read transistor configured to read an output signal of the source follower transistor.

10. A detection device comprising:
a sensor area in which a plurality of detection elements including photoelectric conversion elements are arranged in a matrix having a row-column configuration within a detection region; and
a detector configured to calculate a detection value corresponding to the detection elements based on a voltage generated in the detection elements, wherein
in the detection region of the sensor area, a number of detection elements arranged in a first direction is M, and a number of detection elements arranged in a second direction different from the first direction is N, and
the detector regards a potential difference $\Delta V{<}m,n{>}$ between a voltage $V{<}m,n{>}$ of the detection element in an m-th column and an n-th row arranged in the m-th column (m is a natural number less than or equal to M) in the first direction and arranged in the n-th row (n is a natural number less than or equal to N) in the second direction, and a voltage $V{<}m+1,n{>}$ of the detection element in an m+1-th column and the n-th row arranged in the m+1-th column in the first direction and arranged in the n-th row in the second direction, as a first detection value corresponding to the detection element in the m-th column and n-th row, and calculates a second detection value $V{<}m,n{>}'$ corresponding to the detection element in the m-th column and n-th row using the following equations (3) and (4):

$$V{<}m,n{>}'=V{<}m+1,n{>}'+\Delta V{<}m,n{>} \quad (3)$$

$$V{<}M+1,n{>}'=0 \quad (4).$$

11. The detection device according to claim 10, wherein the detector regards a potential difference $\Delta V\langle M,n\rangle$ between a voltage $V\langle M,n\rangle$ of the detection element in an M-th column and the n-th row arranged in the M-th column in the first direction and arranged in the n-th row in the second direction, and a predetermined offset voltage, as a first detection value corresponding to the detection element in the M-the column and the n-th row, and calculates the second detection value $V\langle m,n\rangle'$.

12. The detection device according to claim 11, further comprising:
 a read control scan line configured to supply a read control signal to the detection elements arranged in the first direction;
 a drive circuit configured to sequentially select the read control scan line along the second direction; and
 an output signal line that is supplied with a voltage generated in the detection elements arranged in the second direction, wherein
 the detector is electrically coupled to the output signal line.

13. The detection device according to claim 12, further comprising a signal line selection circuit configured to sequentially select a plurality of output signal lines among all output signal lines within the detection region along the first direction and electrically couple to the detector in a selection period of the read control scan line, wherein the detector includes:
 a differential amplifying circuit configured to output a potential difference between the voltages generated in the detection elements adjacent in the first direction;
 a first capacitive element coupled to a non-inverting input of the differential amplifying circuit;
 a second capacitive element coupled to an inverting input of the differential amplifying circuit; and
 a switch circuit configured to switch the non-inverting input and the inverting input of the differential amplifying circuit in synchronization with selection switching of the output signal lines and electrically couple to the output signal lines.

14. The detection device according to claim 13, wherein the differential amplifying circuit outputs a potential difference between a voltage charged to the first capacitive element and a voltage charged to the second capacitive element.

15. The detection device according to claim 13, wherein the detector inverts a sign of a first detection value $\Delta V\langle m+1,n\rangle$ with respect to a first detection value $\Delta V\langle m,n\rangle$.

16. The detection device according to claim 13, wherein the detector is provided with one differential amplifying circuit for each of the output signal lines that are sequentially selected by the signal line selection circuit.

17. The detection device according to claim 13, wherein the differential amplifying circuit amplifies and outputs a potential difference between a voltage generated in a first detection element and a voltage generated in a second detection element adjacent to the first detection element in the first direction within the detection region.

* * * * *